(12) United States Patent
Yamazaki et al.

(10) Patent No.: US 11,912,031 B2
(45) Date of Patent: Feb. 27, 2024

(54) PIEZOELECTRIC DEVICE, LIQUID EJECTING HEAD, AND LIQUID EJECTING APPARATUS

(71) Applicant: Seiko Epson Corporation, Tokyo (JP)

(72) Inventors: Yasushi Yamazaki, Azumino (JP); Daisuke Nagano, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 17/646,226

(22) Filed: Dec. 28, 2021

(65) Prior Publication Data

US 2022/0203685 A1 Jun. 30, 2022

(30) Foreign Application Priority Data

Dec. 28, 2020 (JP) ................... 2020-218890

(51) Int. Cl.
*B41J 2/14* (2006.01)
*H10N 30/20* (2023.01)

(52) U.S. Cl.
CPC ...... *B41J 2/14233* (2013.01); *H10N 30/2047* (2023.02)

(58) Field of Classification Search
None
See application file for complete search history.

(56) References Cited

U.S. PATENT DOCUMENTS

| 2008/0062229 A1* | 3/2008 | Tokunaga ............ B41J 2/14233 29/25.35 |
| 2017/0113462 A1 | 4/2017 | Takahashi et al. |
| 2018/0111373 A1* | 4/2018 | Yazaki .................. B41J 2/1612 |

FOREIGN PATENT DOCUMENTS

JP 2017-080946 5/2017

* cited by examiner

*Primary Examiner* — Erica S Lin
(74) *Attorney, Agent, or Firm* — WORKMAN NYDEGGER

(57) ABSTRACT

An active portion of a piezoelectric actuator includes a first region provided in a region opposed to a recess and extending in a first direction, and a second region provided in a region corresponding to a central part in the first direction of the recess, and being configured such that a laminated body including the active portion and a vibration plate has a thickness larger than a thickness of a portion corresponding to the first region and that deformation of the second region is suppressed as compared to deformation of the first region when a voltage is applied between a first electrode and a second electrode.

14 Claims, 12 Drawing Sheets

PIEZOELECTRIC DEVICE, LIQUID EJECTING HEAD, AND LIQUID EJECTING APPARATUS

The present application is based on, and claims priority from JP Application Serial Number 2020-218890, filed Dec. 28, 2020, the disclosure of which is hereby incorporated by reference herein in its entirety.

BACKGROUND

1. Technical Field

The present disclosure relates to a piezoelectric device including a vibration plate and a piezoelectric actuator provided with a first electrode, a piezoelectric layer, and a second electrode, to a liquid ejecting head, and to a liquid ejecting apparatus.

2. Related Art

An ink jet printing head that ejects ink droplets is a typical example of a liquid ejecting head being one of piezoelectric devices. For example, a structure which includes a flow passage forming substrate provided with a pressure chamber to communicate with a nozzle, and a piezoelectric actuator provided on one surface side of this flow passage forming substrate via a vibration plate, and is configured to eject an ink droplet from the nozzle by causing the piezoelectric actuator to generate a change in pressure of the ink in the pressure chamber has been known as a typical ink jet printing head.

Meanwhile, a structure including a first electrode formed on a vibration plate, a piezoelectric layer formed on the first electrode by using a piezoelectric material having an electromechanical conversion property, and a second electrode provided on the piezoelectric layer has been known as a typical piezoelectric actuator. The piezoelectric device including the above-mentioned piezoelectric actuator has a problem of occurrence of cracks in the vibration plate due to flexural deformation of the piezoelectric actuator. Various structures of such a piezoelectric device have been proposed in order to suppress the occurrence of cracks in the vibration plate (see JP-A-2017-80946, for example).

JP-A-2017-80946 discloses a technique for suppressing the occurrence of cracks and the like in a vibration plate serving as a movable region, by pouring and curing an adhesive in a cutout portion formed at a portion of the vibration plate overlapping a partition wall to define a pressure chamber.

The occurrence of cracks in the vibration plate can be suppressed by increasing strength of the vibration plate by adopting structures such as the one disclosed in JP-A-2017-80946. However, it is still difficult to avoid the occurrence of cracks in the vibration plate even if the strength of the vibration plate is increased.

One of factors for the occurrence of cracks in the vibration plate is excessive deformation of the vibration plate attributed to bubbles flowing into the pressure chamber in the course of repeatedly driving the piezoelectric actuator, for example. The timing of the occurrence of cracks in the vibration plate due to such a factor may be delayed by increasing the strength of the vibration plate. However, it is still difficult to avoid the occurrence of the cracks as long as the excessive deformation is repeated.

In the meantime, locations of the occurrence of the cracks in the vibration plate vary depending on the shape of the pressure chamber. For example, when the pressure chamber has such a shape that a length in a first direction is larger than a length in a second direction intersecting with the first direction, the cracks are prone to occur particularly at a central part in the first direction of the pressure chamber.

Note that this problem arises not only in the liquid ejecting head represented by the ink jet printing head that ejects the ink, but also in other piezoelectric devices.

SUMMARY

An aspect of the present disclosure for solving the aforementioned problem provides a piezoelectric device including a vibration plate provided on one surface side of a substrate provided with a plurality of recesses, and a piezoelectric actuator including a first electrode, a piezoelectric layer, and a second electrode stacked on a surface of the vibration plate on an opposite side of the substrate. Here, the recesses have a shape in which a length in a first direction is larger than a length in a second direction intersecting with the first direction. The piezoelectric actuator includes an active portion provided in a region opposed to one of the recesses, in which the piezoelectric layer is sandwiched between the first electrode and the second electrode. Moreover, the active portion includes a first region provided in a region opposed to the recess and extending in the first direction, and a second region provided in a region corresponding to a central part in the first direction of the recess, and being configured such that a laminated body including the active portion and the vibration plate has a thickness larger than a thickness of a portion corresponding to the first region and that deformation of the second region is suppressed as compared to deformation of the first region when a voltage is applied between the first electrode and the second electrode.

Another aspect of the present disclosure provides a liquid ejecting head including a substrate provided with a plurality of recesses, a vibration plate provided on one surface side of the substrate, and a piezoelectric actuator including a first electrode, a piezoelectric layer, and a second electrode stacked on a surface of the vibration plate on an opposite side of the substrate. Here, the recesses have a shape in which a length in a first direction is larger than a length in a second direction intersecting with the first direction. The piezoelectric actuator includes an active portion provided in a region opposed to one of the recesses, in which the piezoelectric layer is sandwiched between the first electrode and the second electrode. Moreover, the active portion includes a first region provided in a region opposed to the recess and extending in the first direction, and a second region provided in a region corresponding to a central part in the first direction of the recess, and being configured such that a laminated body including the active portion and the vibration plate has a thickness larger than a thickness of a portion corresponding to the first region and that deformation of the second region is suppressed as compared to deformation of the first region when a voltage is applied between the first electrode and the second electrode.

Still another aspect of the present disclosure provides a liquid ejecting apparatus including the above-described liquid ejecting head.

DESCRIPTION OF EXEMPLARY EMBODIMENTS

Figure 1:
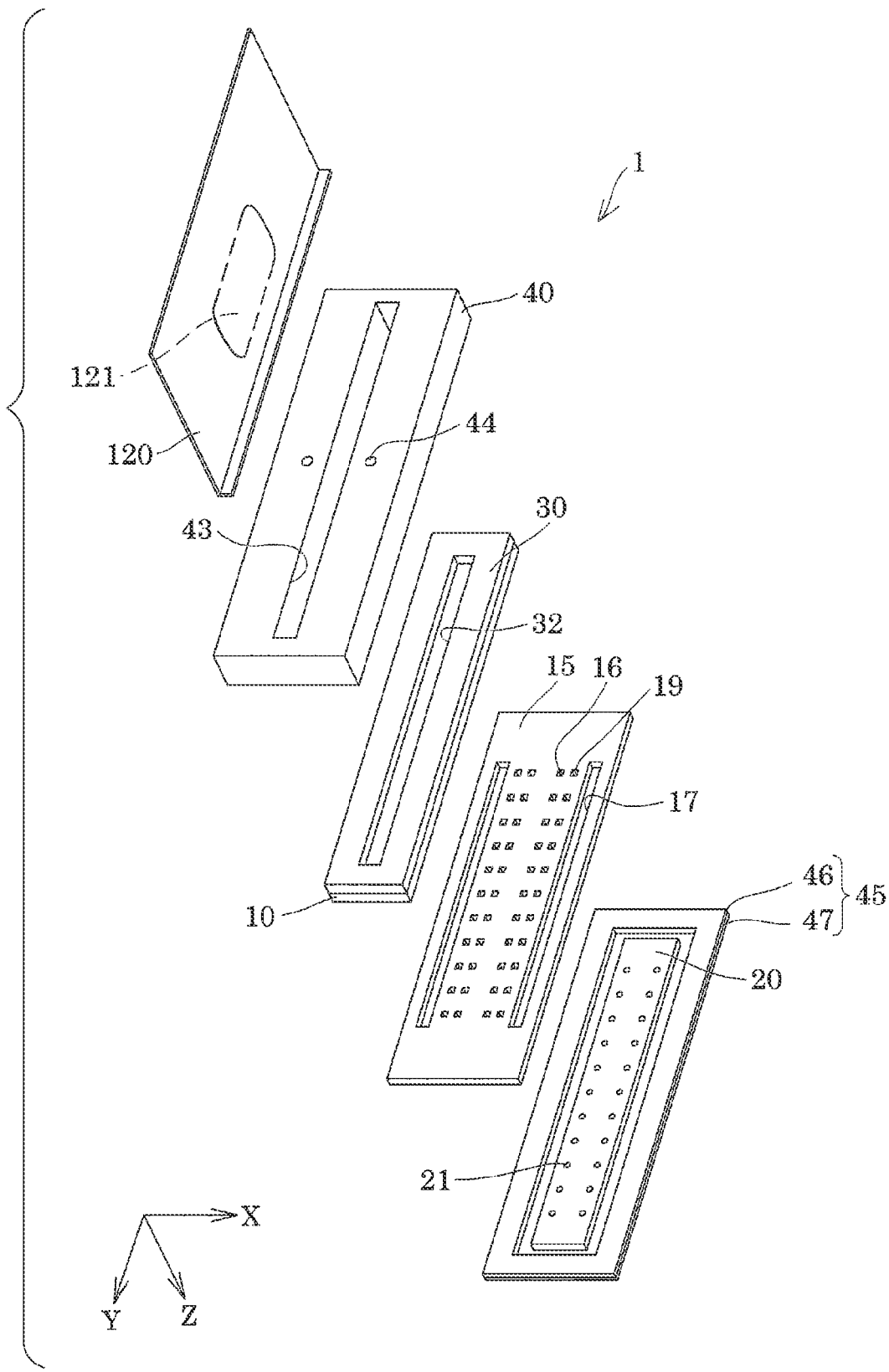
FIG. 1 is an exploded perspective view of a printing head according to a first embodiment.

The present disclosure will be described below in further details based on embodiments. It is to be noted, however, that the following description depicts certain aspects of the present disclosure and a configuration of the present disclosure may be modified as appropriate within the scope of the disclosure. In the drawings, the same constituents will be denoted by the same reference signs and overlapping explanations thereof will be omitted.

Moreover, in the drawings, signs x, y, and z represent three spatial axes that are orthogonal to one another. In this specification, directions along these axes will be defined as x direction, y direction, and z direction, respectively. Regarding the x direction and the y direction, a direction indicated with an arrow in the drawings is explained as a positive (+) direction while an opposite direction of the direction indicated with the arrow will be explained as a negative (−) direction. Meanwhile, the z direction represents a vertical direction. Here, the +z direction indicates a vertically downward direction while the −z direction represents a vertically upward direction. Moreover, three of the x, y, and z spatial axes not restricted to the positive directions or the negative directions will be explained as the x-axis, the y-axis, and the z-axis, respectively.

First Embodiment

Figure 2:
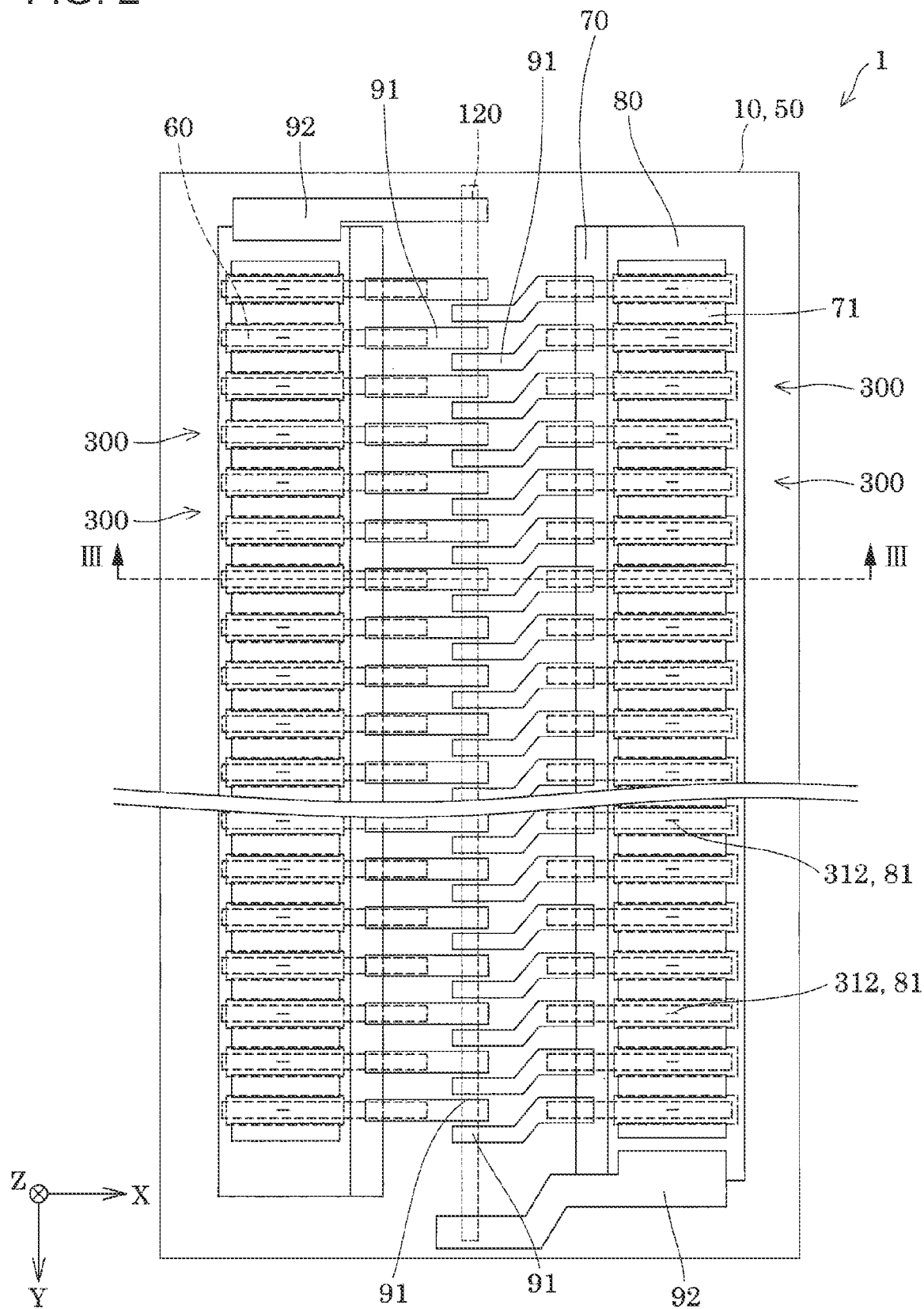
FIG. 2 is a plan view of the printing head according to the first embodiment.
Figure 3:
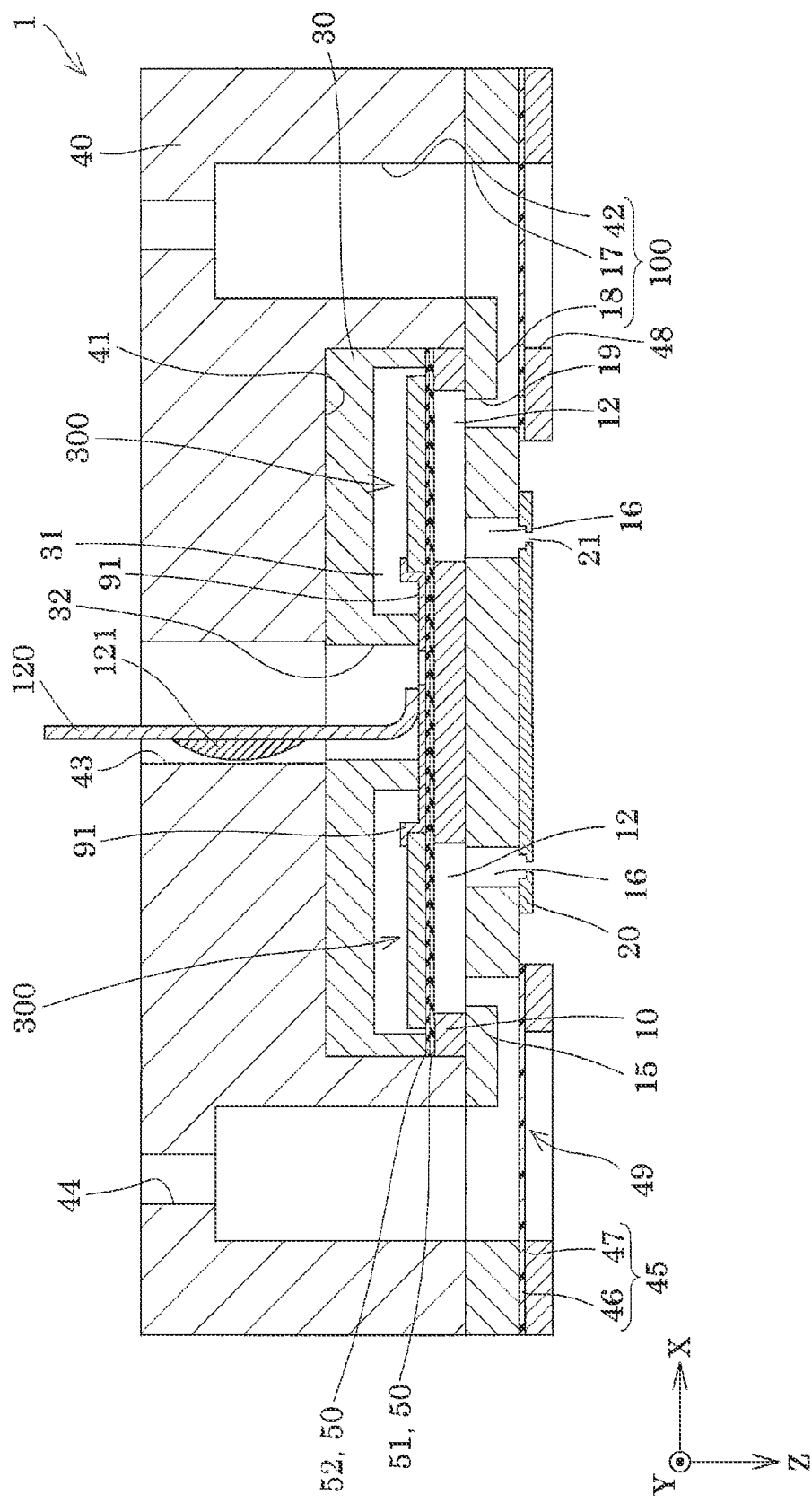
FIG. 3 is a cross-sectional view of the printing head according to the first embodiment.
Figure 4:
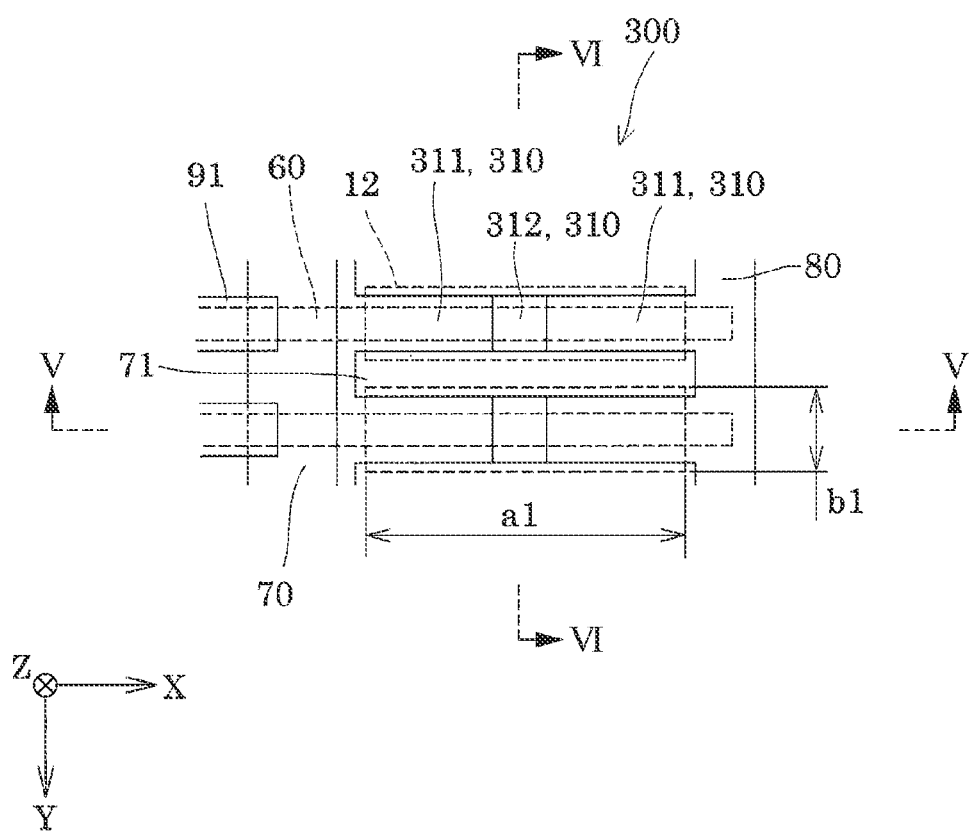
FIG. 4 is a plan view of a substantial part of the printing head according to the first embodiment.
Figure 5:
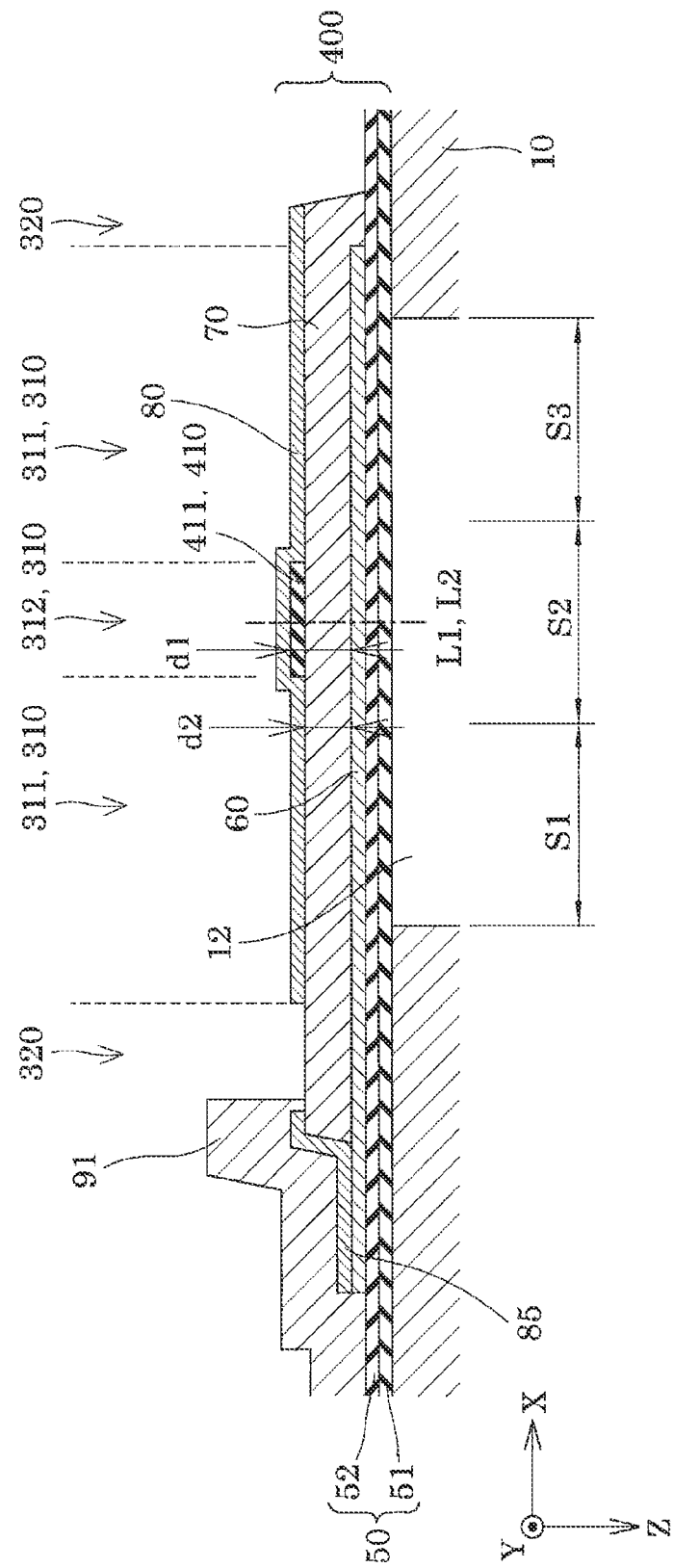
FIG. 5 is a cross-sectional view of the substantial part of the printing head according to the first embodiment.
Figure 6:
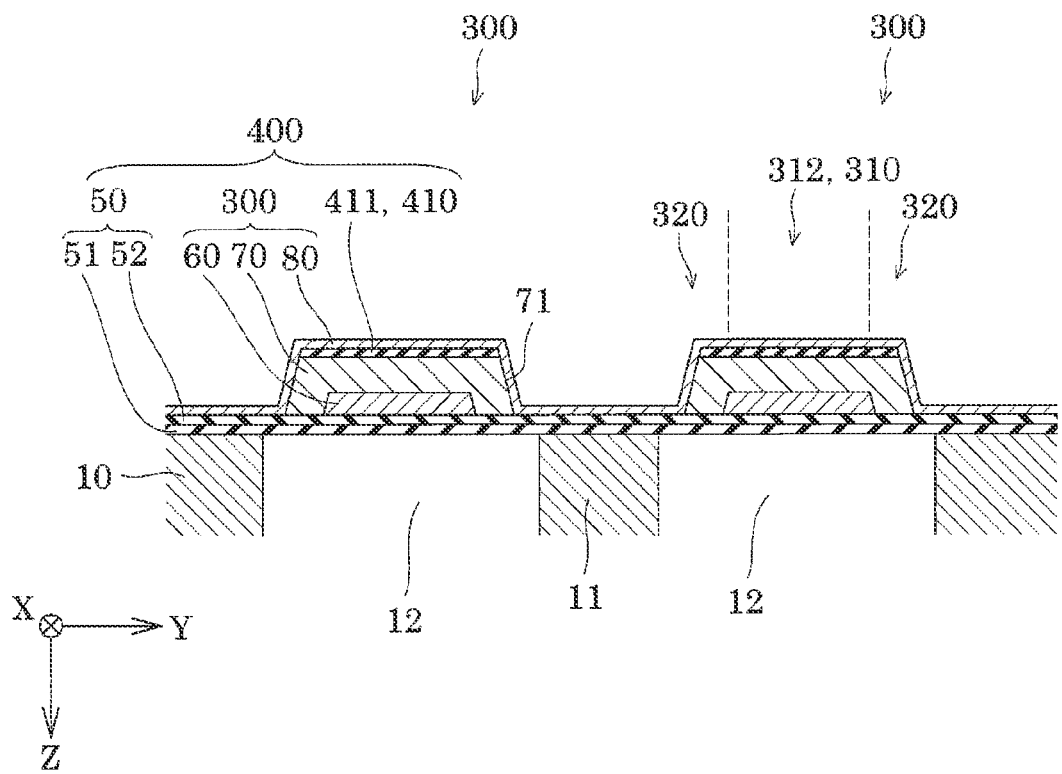
FIG. 6 is another cross-sectional view of the substantial part of the printing head according to the first embodiment.
Figure 7:
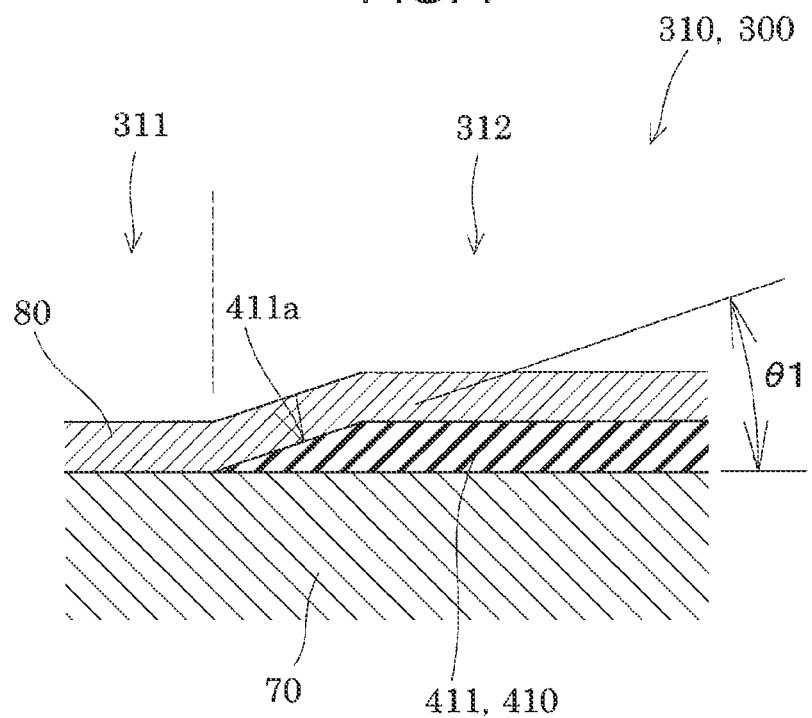
FIG. 7 is an enlarged cross-sectional view of the printing head according to the first embodiment.
Figure 8:
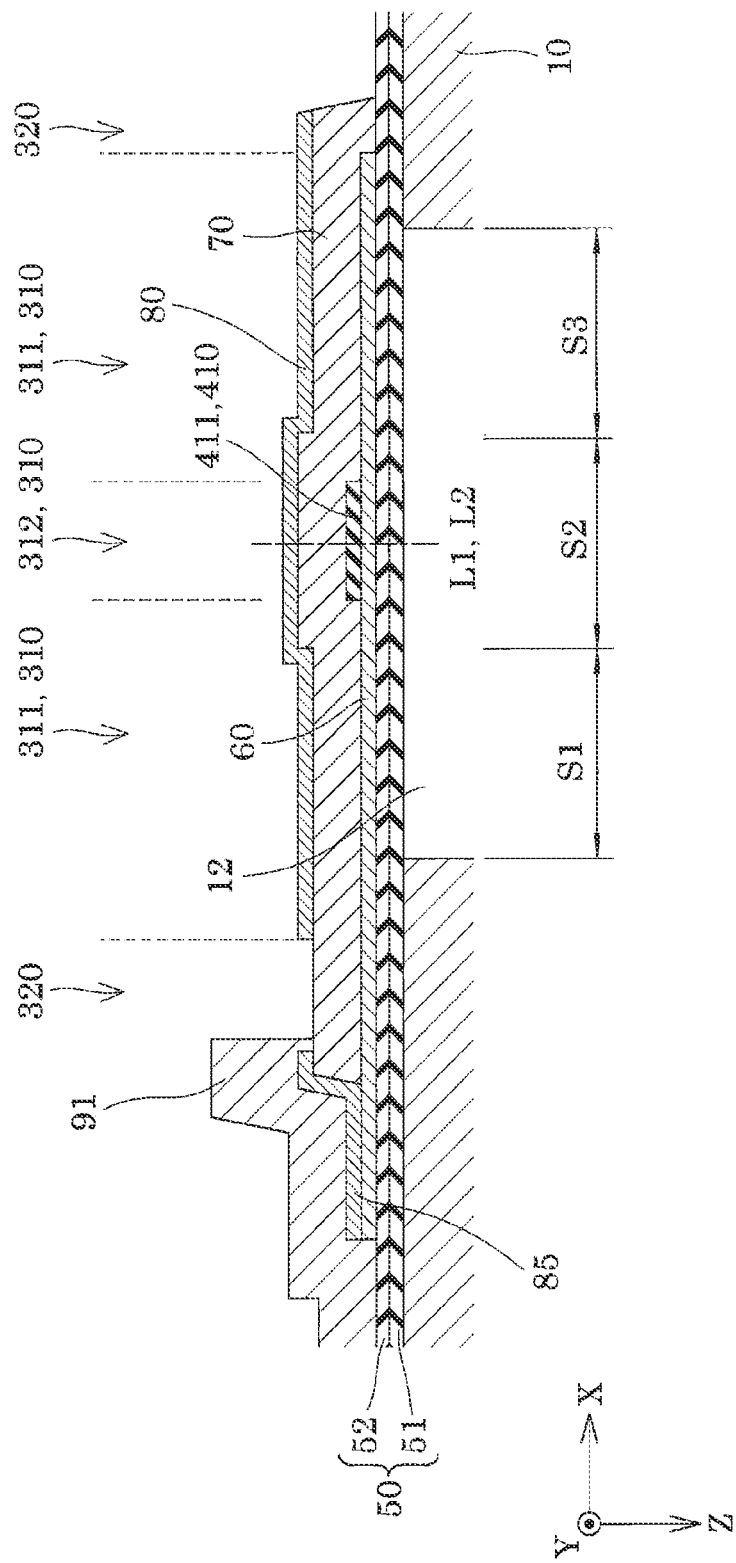
FIG. 8 is a cross-sectional view of a substantial part illustrating a modified example of the printing head according to the first embodiment.
Figure 9:
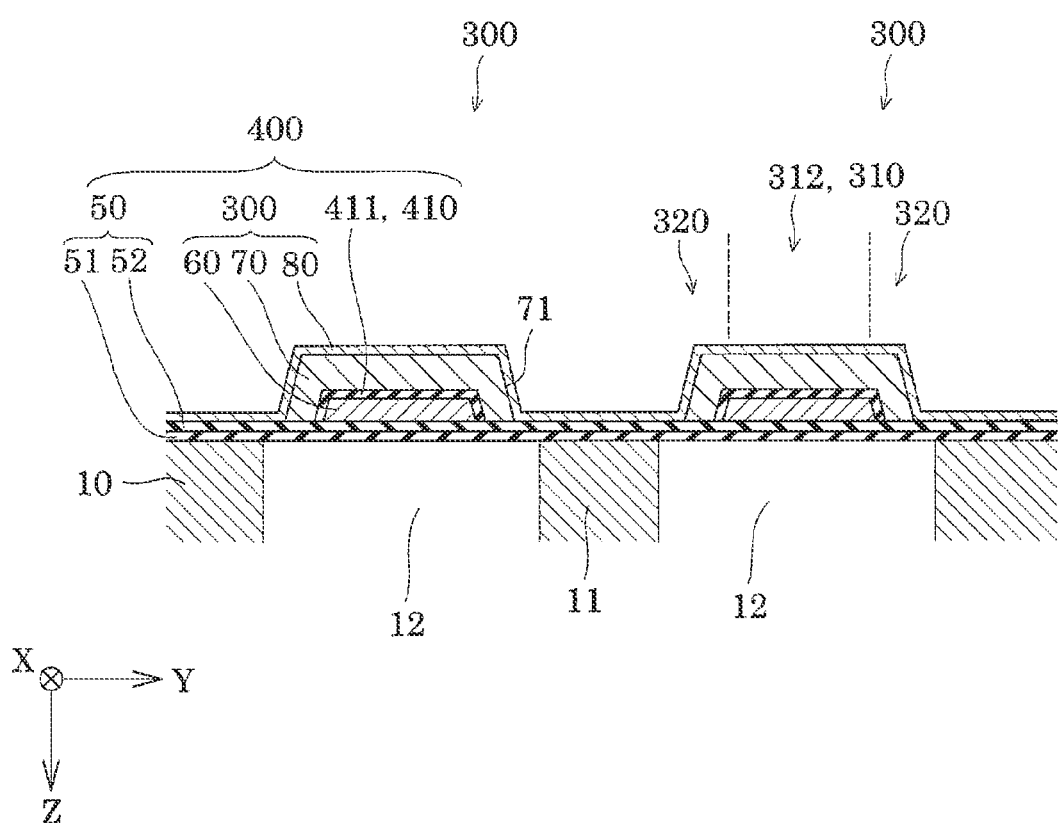
FIG. 9 is another cross-sectional view of the substantial part illustrating the modified example of the printing head according to the first embodiment.

FIG. 1 is an exploded perspective view of an ink jet printing head representing an example of a liquid ejecting head according to a first embodiment of the present disclosure. FIG. 2 is a plan view of the ink jet printing head. FIG. 3 is a cross-sectional view taken along the III-III line in FIG. 2. FIG. 4 is an enlarged plan view of a piezoelectric actuator portion. FIG. 5 is a cross-sectional view taken along the V-V line in FIG. 4, and FIG. 6 is a cross-sectional view taken along the VI-VI line in FIG. 4. Meanwhile, FIG. 7 is an enlarged cross-sectional view of a substantial part of the piezoelectric actuator. FIGS. 8 and 9 are cross-sectional views illustrating a modified example of the piezoelectric actuator according to the first embodiment.

An ink jet printing head (hereinafter also simply referred to as a printing head) 1 representing an example of a liquid ejecting head according to the first embodiment of the present disclosure illustrated in FIGS. 1 and 2 is configured to eject an ink droplet in the z-axis direction, or in the +z direction to be more precise.

The ink jet printing head 1 includes a flow passage forming substrate 10 that represents an example of a substrate. The flow passage forming substrate 10 is made of any of a silicon substrate such as a single crystalline silicon substrate, a glass substrate, an SOI substrate, various ceramic substrates, and the like. Here, the flow passage forming substrate 10 may be a substrate having a (110) plane as a preferential orientation plane or a substrate having a (100) plane as the preferential orientation plane.

The flow passage forming substrate 10 is provided with pressure chambers 12 each being a recess. The pressure chambers 12 are juxtaposed in two rows in the x-axis direction, which is a first direction intersecting with the z-axis. The respective pressure chambers 12 constituting each row are arranged along the y-axis direction, which is a second direction intersecting with the x-axis direction. The pressure chambers 12 constituting each row are located on a straight light along the y-axis direction so as to be located at the same position in the x-axis direction. Every two pressure chambers 12 adjacent to each other in the y-axis direction are partitioned by a partition wall 11.

Needless to say, the layout of the pressure chambers 12 in the flow passage forming substrate 10 is not limited to a particular layout. For example, the layout of the pressure chambers 12 arranged in the y-axis direction may adopt a so-called staggered layout in which every other pressure chamber 12 is located at a position shifted in the x-axis direction, or a zigzag layout other than the aforementioned staggered layout in which the pressure chambers 12 are shifted in the x-axis direction to form a zigzag.

Here, each pressure chamber 12 is formed into such a shape that a length a1 in the x-axis direction is larger than a length b1 in the y-axis direction in plan view in the z-axis direction (see FIG. 4). In this embodiment, the pressure chamber 12 is formed into a rectangle in plan view in the z-axis direction. In other words, the pressure chamber 12 is formed to have an aspect ratio greater than 1. In this embodiment, the pressure chamber 12 is formed to have an aspect ratio of about 9 to 1. In this structure, a longitudinal direction of the pressure chamber 12 corresponds to the x-axis direction being the first direction, and a lateral direction of the pressure chamber 12 corresponds to the y-axis direction being the second direction.

Here, the shape of the pressure chamber 12 only needs to satisfy a relation of the length a1 in the x-axis direction>the length b1 in the y-axis direction. Besides the rectangular shape, the shape of the pressure chamber 12 may be a parallelogram shape, an oval shape being a shape including an elliptical shape, and so forth.

A communicating plate 15, a nozzle plate 20, and a compliance substrate 45 are stacked in sequence on the +z direction side of the flow passage forming substrate 10 provided with the pressure chambers 12.

The communicating plate 15 is provided with nozzle communication passages 16, each of which establishes communication between the pressure chamber 12 and a nozzle 21 to eject an ink droplet. Moreover, the communicating plate 15 is provided with a first manifold portion 17 and a second manifold portion 18, which constitute part of a manifold 100 that serves as a common liquid chamber that communicates with the pressure chambers 12. The first manifold portion 17 is provided penetrating the communicating plate 15 in the z-axis direction. The second manifold portion 18 is provided to be open to a surface on the +z direction side of the communicating plate 15 without penetrating the communicating plate 15 in the z-axis direction.

Furthermore, the communicating plate 15 is provided with supply communication passages 19 each communicating with an end portion in the x-axis direction of the corresponding pressure chamber 12. The respective supply communication passages 19 are provided independently of one another so as to correspond to the respective pressure chambers 12. Each of these supply communication passages 19 establishes communication between the second manifold portion 18 and each pressure chamber 12, thereby supplying the ink in the manifold 100 to each pressure chamber 12.

Any of a silicon substrate, a glass substrate, an SOI substrate, various ceramic substrates, a metallic substrate, and the like can be used for the communicating plate 15. Examples of the metallic substrate include a stainless steel substrate and the like. Here, the communicating plate 15 may adopt a material having substantially the same thermal expansion coefficient as that of the flow passage forming substrate 10. In this way, it is possible to suppress warpage of the flow passage forming substrate 10 and the communicating plate 15 attributed to a difference in thermal expansion coefficient in the case of a change in temperature of the flow passage forming substrate 10 and the communicating plate 15.

The nozzle plate 20 is provided at the communicating plate 15 on the opposite side of the flow passage forming substrate 10, or in other words, at the surface on the +z direction side. The nozzle plate 20 is provided with the nozzles 21 that communicate with the respective pressure chambers 12 through the nozzle communication passages 16.

In this embodiment, the nozzles 21 are arranged in a line along the y-axis direction. Moreover, the nozzle plate 20 is provided with nozzle rows in which the nozzles 21 are juxtaposed in two rows in the x-axis direction. In other words, the nozzles 21 in each row are arranged at the same position in the x-axis direction. The layout of these nozzles 21 is not limited to a particular layout. For example, if the pressure chambers 12 are laid out in a so-called staggered manner, then the nozzles 21 constituting each row may also be arranged in a so-called staggered manner in conformity to the arrangement of the pressure chambers 12.

As for a material of the nozzle plate 20, any of a silicon substrate, a glass substrate, an SOI substrate, various ceramic substrates, a metallic substrate, and the like can be used, for example. Examples of the metallic substrate include a stainless steel substrate and the like. Moreover, organic substances such as polyimide resin can also be used as the material of the nozzle plate 20. Nonetheless, the nozzle plate 20 may adopt a material having substantially the same thermal expansion coefficient as that of the communicating plate 15. In this way, it is possible to suppress warpage of the nozzle plate 20 the communicating plate 15 attributed to a difference in thermal expansion coefficient in the case of a change in temperature of the nozzle plate 20 and the communicating plate 15.

The compliance substrate 45 is provided together with the nozzle plate 20 at the communicating plate 15 on the opposite side of the flow passage forming substrate 10, or in other words, at the surface on the +z direction side. This compliance substrate 45 is provided around the nozzle plate 20 so as to seal openings of the first manifold portion 17 and the second manifold portion 18 provided to the communicating plate 15. In this embodiment, the compliance substrate 45 includes a sealing film 46 formed from a flexible thin film, and a fixation substrate 47 formed from a hard material such as a metal. A region of the fixation substrate 47 opposed to the manifold 100 is formed into an opening 48 by removing the material completely in a thickness direction. Accordingly, a surface on one side of the manifold 100 serves as a compliance unit 49 which is sealed solely with the flexible sealing film 46.

Meanwhile, a vibration plate 50 and piezoelectric actuators 300 to generate a change in pressure in the ink inside the pressure chambers 12 by bringing the vibration plate 50 to flexural deformation are provided at the flow passage forming substrate 10 on the opposite side of the nozzle plate 20 and the like, or in other words, at the surface on the −z direction side. Details of the vibration plate 50 and the piezoelectric actuators 300 will be described later. Note that FIG. 3 is the diagram for explaining an overall configuration of the ink jet printing head 1, and a configuration of the piezoelectric actuators 300 is illustrated in a simplified manner.

Moreover, a protection substrate 30 having substantially the same size as the flow passage forming substrate 10 is attached to a surface on the −z direction side of the flow passage forming substrate 10 by using an adhesive or the like. The protection substrate 30 includes holding portions 31 which are spaces for protecting the piezoelectric actuators 300. The holding portions 31 are independently provided for the respective rows of the piezoelectric actuators 300 arranged in the y-axis direction, and two holding portions 31 are formed to be juxtaposed in the x-axis direction. Meanwhile, the protection substrate 30 is provided with a through hole 32, which is located between the two holding portions 31 juxtaposed in the x-axis direction in such a way as to penetrate the protection substrate 30 in the z-axis direction.

In the meantime a case member 40 that defines the manifold 100, which communicates with the pressure chambers 12, in conjunction with the flow passage forming substrate 10 is fixed onto the protection substrate 30. The case member 40 has substantially the same shape as the communicating plate 15 in plan view, and is joined to the protection substrate 30 and joined to the communicating plate 15 as well.

The above-mentioned case member 40 includes a housing unit 41, which is a space having a sufficient depth for containing the flow passage forming substrate 10 and the protection substrate 30 therein and being located on the protection substrate 30 side. This housing unit 41 has an opening area larger than an area of a surface of the protection substrate 30 joined to the flow passage forming substrate 10. Moreover, an opening surface on the nozzle plate 20 side of the housing unit 41 is sealed by the communicating plate 15 in a state where the flow passage forming substrate 10 and the protection substrate 30 are housed in the housing unit 41.

Meanwhile, in the case member 40, third manifold portions 42 are defined on two outer sides in the x-axis direction of the housing unit 41, respectively. Moreover, the manifold 100 is formed from the first manifold portion 17 and the second manifold portion 18 provided to the communicating plate 15 and the third manifold portion 42. The manifold 100 is provided continuously across the y-axis direction, and the supply communication passages 19 to establish communication between the respective pressure chambers 12 and the manifold 100 are arranged in the y-axis direction.

In the meantime, the case member 40 is provided with inlet ports 44 communicating with the respective manifolds 100 for supplying the ink to the manifolds 100. In addition, the case member 40 is provided with a coupling port 43 configured to communicate with the through hole 32 in the protection substrate 30 and into which a wiring substrate 120 is inserted.

In the above-described ink jet printing head 1 of this embodiment, the ink is taken in from the inlet port 44 coupled to a not-illustrated external ink supply unit and the inside ranging from the manifolds 100 to the nozzles 21 is filled with the ink. Thereafter, a voltage is applied to each of the piezoelectric actuators 300 corresponding to the respective pressure chambers 12 in accordance with a print signal from a driving circuit 121. Thus, each vibration plate 50 is flexurally deformed together with the piezoelectric actuator 300, whereby the pressure inside each pressure chamber 12 is increased and an ink droplet is ejected from each nozzle 21.

Now, a configuration of the piezoelectric actuator 300 of this embodiment will be described below. As discussed earlier, the piezoelectric actuator 300 is provided at the surface of the flow passage forming substrate 10 on the opposite side of the nozzle plate 20 through the intermediary of the vibration plate 50.

As illustrated in FIGS. 4 to 6, the vibration plate 50 is formed from an elastic film 51 made of silicon oxide provided on the flow passage forming substrate 10 side, and an insulator film 52 made of a zirconium oxide film provided on the elastic film 51. Each liquid flow channel such as the pressure chamber 12 is formed by subjecting the flow passage forming substrate 10 to anisotropic etching from its surface on the +z direction side, and a surface on the −z direction side of the pressure chamber 12 or the like is formed from the elastic film 51.

Note that the configuration of the vibration plate 50 is not limited. For example, the vibration plate 50 may be formed from one of the elastic film 51 and the insulator film 52, or may further include a film other than the elastic film 51 and the insulator film 52. Examples of the material of such a film may include silicon, silicon nitride, and the like.

The piezoelectric actuator 300 is a pressure generation unit provided corresponding to each pressure chamber 12 formed in the flow passage forming substrate 10 and configured to cause a change in pressure of the ink inside the pressure chamber 12. The piezoelectric actuator 300 is also referred to as a piezoelectric element. This piezoelectric actuator 300 includes a first electrode 60, a piezoelectric layer 70, and a second electrode 80, which are stacked in sequence from the +z direction side being the vibration plate 50 side toward the −z direction side. In other words, the piezoelectric actuator 300 includes the first electrode 60, the piezoelectric layer 70, and the second electrode 80, which are stacked in sequence in the z-axis direction being a first direction relative to the vibration plate 50, or in a direction toward the −z direction side in this embodiment.

In the piezoelectric actuator 300 having the above-described structure, a portion that causes a piezoelectric strain in the piezoelectric layer 70 when the voltage is applied between the first electrode 60 and the second electrode 80 will be referred to as an active portion. On the other hand, a potion that does not cause the piezoelectric strain in the piezoelectric layer 70 will be referred to as a non-active portion. In other words, of the piezoelectric actuator 300, a portion in which the piezoelectric layer 70 is sandwiched between the first electrode 60 and the second electrode 80 serves as an active portion 310 while a portion in which the piezoelectric layer 70 is not sandwiched between the first electrode 60 and the second electrode 80 serves as a non-active portion 320. In the meantime, when driving the piezoelectric actuator 300, a portion actually deformed in the z-axis direction will be referred to as a flexible portion while a portion not deformed in the z-axis direction will be referred to as a non-flexible portion. In other words, of the active portion 310 of the piezoelectric actuator 300, a portion opposed to the pressure chamber 12 in the z-axis direction serves as the flexible portion while a portion thereof located outside of the pressure chamber 12 serves as the non-flexible portion.

In general, one of the electrodes in the active portion 310 constitutes an individual electrode which is independently provided for each active portion 310, while the other electrode therein constitutes a common electrode which is common to the active portions 310. In this embodiment, the first electrode 60 constitutes the individual electrode while the second electrode 80 constitutes the common electrode.

To be more precise, the first electrodes 60 constituting the piezoelectric actuators 300 are cut out for the respective pressure chambers 12 and constitute the individual electrodes independently provided to the respective active portions 310. Each first electrode 60 is formed into a width narrower than the width of the pressure chamber 12, that is, the length b1 in the y-axis direction of the pressure chamber 12. Moreover, two end portions in the y-axis direction of the first electrode 60 are located inside of end portions in the y-axis direction of the pressure chamber 12, respectively. In other words, the active portion 310 of the piezoelectric actuator 300 is provided opposite to each pressure chamber 12 at the narrower width than that of the pressure chamber 12.

In terms of the x-axis direction, the first electrode 60 extends to two outer sides of the pressure chamber 12. In other words, two end portions in the x-axis direction of the first electrode 60 are located outside of end portions in the x-axis direction of the pressure chamber 12, respectively. Here, the two end portions in the x-axis direction of the first electrode 60 may be located inside of the end portions of the pressure chamber 12. Nonetheless, the two end portions may extend to the vicinity of the two end portions of the pressure chamber 12 even in this case.

A material of the first electrode 60 is not limited to a particular material. However, the first electrode 60 adopts a conductive material such as a metal as typified by iridium and platinum, and a conductive metal oxide as typified by indium tin oxide abbreviated as ITO.

The piezoelectric layer 70 is provided continuously across the y-axis direction regarded as the lateral direction of the pressure chambers 12 while setting a length in the x-axis direction being the longitudinal direction of the pressure chambers 12 to a predetermined length. In other words, the piezoelectric layer 70 is continuously provided at a predetermined thickness along the direction of arrangement of the pressure chambers 12. Although the thickness of the piezoelectric layer 70 is not limited, the piezoelectric layer 70 is formed at a thickness in a range from about 1 to 4 μm, for example. Meanwhile, although the length in the x-axis direction of the piezoelectric layer 70 is not limited, the piezoelectric layer 70 extends more than the length in the x-axis direction of each pressure chamber 12 as illustrated in FIG. 4. Hence, the piezoelectric layer 70 extends beyond the two end portions in the x-axis direction of the pressure chamber 12.

As described above, the strength of the vibration plate 50 in the vicinity of each end portion in the x-axis direction of the pressure chamber 12 is increased as a consequence of extension of the piezoelectric layer 70 to the outside in the x-axis direction of the pressure chamber 12. Accordingly, when the piezoelectric actuator 300 is driven, it is possible to suppress the occurrence of cracks in the vibration plate 50 in the vicinity of the end portion in the longitudinal direction of the pressure chamber 12.

In this embodiment, an end portion in the +x direction of the piezoelectric layer 70 is located outside of an end portion of the first electrode 60, and an end portion in the +x direction of the first electrode 60 is covered with the piezoelectric layer 70 as mentioned above. On the other hand, an end portion in the −x direction of the piezoelectric layer 70 is located inside of the end portion of the first electrode 60, and an end portion in the −x direction of the first electrode 60 is exposed without being covered with the piezoelectric layer 70.

Meanwhile, groove portions 71 each formed by removing at least part of the piezoelectric layer 70 in the z-axis direction are provided at respective regions opposed to the two end portions in the y-axis direction of the pressure chamber 12. In other words, the thickness of the piezoelectric layer 70 at the region opposed to each of the two end portions in the y-axis direction of the pressure chamber 12 is made less than the remaining portion. Each groove portion 71 of this embodiment is formed by removing the corresponding portion of the piezoelectric layer 70 substantially entirely in the z-axis direction. Of course, the groove portion 71 may be formed by removing part of the piezoelectric layer 70 in the z-axis direction and a portion of the piezoelectric layer 70 reduced in thickness as compared to the remaining portion thereof may be left on a bottom surface of the groove portion 71.

Meanwhile, a length in the y-axis direction of the groove portion 71 provided on each partition wall 11, or in other words, a width of the groove portion 71 is formed larger than the width of the partition wall 11. Specifically, each groove portion 71 is continuously formed from above the partition wall 11 toward regions opposed to two pressure chambers 12 adjacent thereto. The groove portion 71 may be provided independently in each region opposed to the end portion of the pressure chamber 12 in the y-axis direction. In other words, two groove portions 71 may be provided in the region opposed to each partition wall 11.

Moreover, the groove portion 71 is formed into a rectangular shape in plan view in the z-axis direction. The shape of the groove portion 71 is not limited to a particular shape. For example, the groove portion 71 may be formed into a pentagonal shape or other polygonal shapes with more angles, or may be formed into a circular shape, an elliptical shape, and the like.

Formation of the above-described groove portion 71 in the piezoelectric layer 70 reduces rigidity of a portion of the vibration plate 50 opposed to an end portion in the y-axis direction of the pressure chamber 12, or so-called an arm of the vibration plate 50. Thus, the piezoelectric actuator 300 and the vibration plate 50 can be favorably deformed when the voltage is applied to the piezoelectric actuator 300.

The piezoelectric layer 70 may be a crystalline film having a perovskite structure (a perovskite-type crystal) made of a ferroelectric ceramic material with an electromechanical conversion property to be formed on the first electrode 60. Examples of materials usable for the piezoelectric layer 70 include a ferroelectric piezoelectric material such as lead zirconate titanate (PZT), and a substance prepared by adding a metal oxide such as niobium oxide, nickel oxide, and a magnesium oxide to the aforementioned ferroelectric piezoelectric material. To be more precise, it is possible to use lead titanate ($PbTiO_3$), lead zirconate titanate ($Pb(Zr,Ti)O_3$), lead zirconate ($PbZrO_3$), lead lanthanum titanate ($(Pb,La)TiO_3$), lead lanthanum zirconate titanate ($(Pb,La)(Zr,Ti)O_3$), lead zirconium titanate magnesium niobate ($Pb(Zr,Ti)(Mg,Nb)O_3$), and the like. In this embodiment, lead zirconate titanate (PZT) is used as the piezoelectric layer 70.

Meanwhile, the materials of the piezoelectric layer 70 are not limited only to the lead-based piezoelectric materials containing lead, but may also adopt lead-free piezoelectric materials containing no lead. Examples of such lead-free piezoelectric materials include bismuth ferrite ($BiFeO_3$, abbreviated as "BFO"), barium titanate ($BaTiO_3$, abbreviated as "BT"), sodium potassium niobate ($(K,Na)(NbO_3)$, abbreviated as "KNN"), potassium sodium lithium niobate ($(K,Na,Li)(NbO_3)$), potassium sodium lithium niobate tantalate ($(K,Na,Li)(Nb,Ta)O_3$), bismuth potassium titanate ($(Bi_{1/2}K_{1/2})TiO_3$, abbreviated as "BKT"), bismuth sodium titanate ($(Bi_{1/2}Na_{1/2})TiO_3$, abbreviated as "BNT"), bismuth manganate ($BiMnO_3$, abbreviated as "BM"), a perovskite composite oxide containing bismuth, potassium, titanium, and iron ($x[(Bi_xK_{1-x})TiO_3]-(1-x)[BiFeO_3]$, abbreviated as "BKT-BF"), a perovskite composite oxide containing bismuth, iron, barium, and titanium ($(1-x)[BiFeO_3]-x[BiTiO_3]$, abbreviated as "BFO-BT"), a substance prepared by adding metal such as manganese, cobalt, and chromium to the above-mentioned perovskite composite oxide ($(1-x)[Bi(Fe_{1-y}M_y)O_3]-x[BaTiO_3]$ (where M is Mn, Co, or Cr), and the like.

As illustrated in FIGS. 5 and 6, the second electrode 80 is provided on the −z direction side of the piezoelectric layer 70 which is the opposite side of the first electrode 60, and constitutes the common electrode that is common to the piezoelectric actuators 300. The second electrode 80 is provided continuously across the y-axis direction while setting a length in the x-axis direction to a predetermined length. This second electrode 80 is also provided on an inner surface of the groove portion 71, that is, on each side surface of the groove portion 71 in the piezoelectric layer 70 and on the insulator film 52 constituting the bottom surface of the groove portion 71. Nevertheless, concerning the inside of the groove portion 71, the second electrode 80 may be provided on only part of the inner surface of the groove portion 71.

An end portion in the +x direction of the second electrode 80 is located outside of the end portion in the +x direction of the first electrode 60 covered with the piezoelectric layer 70. Specifically, the end portion in the +x direction of the second electrode 80 is located outside of the end portion in the +x direction of the pressure chamber 12 and outside of the end portion of the first electrode 60. In this embodiment, the end portion in the +x direction of the second electrode 80 substantially coincides with the end portion of the piezoelectric layer 70. For this reason, an end portion in the +x direction of the active portion 310, that is, a boundary between the active portion 310 and the non-active portion 320 is defined by the end portion in the +x direction of the first electrode 60.

On the other hand, an end portion in the −x direction of the second electrode 80 is located outside of an end portion in the −x direction of the pressure chamber 12 but is located inside of the end portion in the x-axis direction of the piezoelectric layer 70. As described above, the end portion in the −x direction of the piezoelectric layer 70 is located inside of the end portion of the first electrode 60. Accordingly, the end portion in the −x direction of the second electrode 80 is located on the piezoelectric layer 70 on the inside of the end portion in the −x direction of the first electrode 60. For this reason, there is a portion on the outside of the end portion in the −x direction of the second electrode 80 where the surface of the piezoelectric layer 70 is exposed.

As described above, the end portion in the −x direction of the second electrode 80 is located on the +x direction side relative to the end portions in the −x direction of the piezoelectric layer 70 and of the first electrode 60. As a consequence, the end portion in the −x direction of the active portion 310, that is, the boundary between the active portion 310 and the non-active portion 320 is defined by the end portion in the −x direction of the second electrode 80.

A material of the second electrode 80 is not limited to a particular material. However, as with the first electrode 60, a conductive material such as a metal as typified by iridium and platinum, and a conductive metal oxide as typified by indium tin oxide is suitably used.

Meanwhile, a wiring portion 85 that is formed form the same layer as the second electrode 80 but is electrically discontinuous with the second electrode 80 is provided on the outside of the end portion in the −x direction of the second electrode 80, that is, at a portion located further on the −x direction side of the end portion of the second electrode 80. Moreover, the wiring portion 85 is formed from a portion on the piezoelectric layer 70 to a portion on the first electrode 60 that extends in the −x direction from the piezoelectric layer 70 in a state of providing an interval so as not to come into contact with the end portion in the −x direction of the second electrode 80. This wiring portion 85 is independently formed for each active portion 310. In other words, the wiring portions 85 are located at given intervals along the y-axis direction. Here, the wiring portions 85 may be formed from a different layer from the second electrode 80. In this case, however, the wiring portions 85 may be formed by using the same layer as the second electrode 80. This makes it possible to simplify a manufacturing process for the wiring portions 85 and to achieve cost reduction.

Here, an individual lead electrode 91 and a common lead electrode 92, which is a common driving electrode, are coupled to the first electrode 60 and the second electrode 80 constituting the piezoelectric actuator 300, respectively (see FIG. 2 and the like). The flexible wiring substrate 120 is coupled to end portions of the individual lead electrode 91 and the common lead electrode 92 on the opposite side of end options thereof which are coupled to the piezoelectric actuator 300 (see FIG. 3 and the like). In this embodiment, each of the individual lead electrode 91 and the common lead electrode 92 extends to be exposed to the inside of the through hole 32 formed in the protection substrate 30, and is electrically coupled to the wiring substrate 120 inside this through hole 32. The driving circuit 121 provided with a switching element for driving each piezoelectric actuator 300 is mounted on the wiring substrate 120.

In this embodiment, the individual lead electrode 91 and the common lead electrode 92 are formed from the same layer. However, these electrodes are formed in such a way as to be electrically discontinuous with each other. In this way, it is possible to simplify manufacturing processes and to achieve cost reduction as compared to a case of forming the individual lead electrode 91 and the common lead electrode 92 one by one. Of course, the individual lead electrode 91 and the common lead electrode 92 may be formed from different layers.

A material of the individual lead electrode 91 and the common lead electrode 92 is not limited to a particular material as long as the material has electric conductivity. For example, it is possible to use gold (Au), platinum (Pt), aluminum (Al), copper (Cu), and the like. In this embodiment, gold (Au) is used as the material of the individual lead electrode 91 and the common lead electrode 92. Meanwhile, the individual lead electrode 91 and the common lead electrode 92 may include an adhesion layer for improving adhesion to the first electrode 60, the second electrode 80, and the vibration plate 50.

The individual lead electrode 91 is provided for each active portion 310, that is, for each first electrode 60. The individual lead electrode 91 is coupled through the wiring portion 85 to a portion in the vicinity of the end portion in the −x direction of the first electrode 60 provided on the outside of the piezoelectric layer 70, and is drawn out in the −x direction onto the flow passage forming substrate 10 or actually onto the vibration plate 50. On the other hand, the common lead electrode 92 is taken out in the −x direction from a portion above the second electrode 80 constituting the common electrode on the piezoelectric layer 70 onto the vibration plate 50 at its two end portions in the y-axis direction.

In the meantime, as mentioned above, the piezoelectric actuator 300 includes the active portion 310 and the non-active portion 320, and the portion of the active portion 310 opposed to the pressure chamber 12 serves as the flexible portion while the portion located outside of the pressure chamber 12 serves as the non-flexible portion.

Moreover, the portion of the active portion 310 opposed to the pressure chamber 12, that is, the flexible portion includes a first region 311 that extends in the x-axis direction, and a second region 312 that is provided in a region corresponding to a central part in the x-axis direction of the pressure chamber 12 in which the deformation when the voltage is applied between the first electrode 60 and the second electrode 80 is suppressed relative to the first region 311.

While the portion of the active portion 310 opposed to the pressure chamber 12 is mainly formed from the first region 311, a portion corresponding to the central part in the x-axis direction of the pressure chamber 12 is formed into the second region 312. In other words, the active portion 310 includes the second region 312 located at the central part in the x-axis direction of the pressure chamber 12, and the portion opposed to the pressure chamber 12 except the second region 312 is formed into the first region 311. Meanwhile, in terms of the y-axis direction, the second region 312 is continuously provided throughout the active portion 310. Specifically, in the y-axis direction, the second region 312 is continuously present throughout the region opposed to the first electrode 60.

Moreover, in this second region 312, a thickness of a laminated body 400 that includes respective layers of the vibration plate 50 and the active portion 310 is made larger than a thickness of a portion corresponding to the first region 311. In other words, in the laminated body 400, the thickness of the portion corresponding to the central part in the x-axis direction of the pressure chamber 12 is made larger than the thickness of the portion corresponding to the vicinity of each end portion of the pressure chamber 12. As a consequence, the deformation of the second region 312 of the active portion 310 is suppressed relative to the first region 311 when the voltage is applied between the first electrode 60 and the second electrode 80.

Any portion in a thickness direction of the laminated body 400 corresponding to the second region 312 may be formed thick. Nonetheless, a thickness of a portion of the laminated body 400 located closer to the piezoelectric actuator 300 than to the vibration plate 50 may be larger than a thickness of a portion of the laminated body 400 corresponding to the first region 311.

In this embodiment, the laminated body 400 includes an additional layer 410 located between the piezoelectric layer 70 and the second electrode 80 and provided separately from the respective layers constituting the vibration plate 50 and the piezoelectric actuator 300. Accordingly, the portion of the laminated body 400 corresponding to the second region 312 is formed thicker than the portion thereof corresponding to the first region 311. Although a material of the additional layer 410 is not limited to a particular material, an insulating material or the like may be used, for example. The additional layer 410 of this embodiment is an insulating layer 411 made of an inorganic insulating material, for example, which is selectively provided to the portion of the laminated body 400 corresponding to the second region 312.

By providing the insulating layer 411 as described above, the second region 312 of the active portion 310 increases rigidity and its deformation is suppressed relative to the first region 311 when the voltage is applied between the first electrode 60 and the second electrode 80. In short, when driving the piezoelectric actuator 300, displacement of the vibration plate 50 at the central part in the x-axis direction of the pressure chamber 12 is partially suppressed. This makes it possible to suppress the occurrence of cracks in the vibration plate 50 associated with repeated drive of the piezoelectric actuator 300. In particular, it is possible to suppress the occurrence of cracks at a portion of the vibration plate 50 corresponding to the central part in the x-axis direction of the pressure chamber 12.

When the pressure chamber 12 is formed into a rectangle which is long in the x-axis direction in plan view in the z-axis direction as described in this embodiment, the displacement of the vibration plate 50 associated with the drive of the piezoelectric actuator 300 grows larger at the central part in the x-axis direction of the pressure chamber 12, whereby cracks are apt to occur in this region of the vibration plate 50. Although such cracks in the vibration plate 50 can be suppressed by controlling the deformation of the entire piezoelectric actuator 300 to a small level, this operation may lead to a deterioration in ejection characteristic such as an amount of ejection of ink droplets and an ejection speed.

On the other hand, it is possible to suppress cracks in the vibration plate 50 effectively while maintaining the good ejection characteristic by partially reducing the deformation of the piezoelectric actuator 300 at the central part in the x-axis direction of the pressure chamber 12 as mentioned above.

Moreover, in this embodiment, the insulating layer 411 is provided between the piezoelectric layer 70 and the second electrode 80. Accordingly, a distance d1 between the first electrode 60 and the second electrode 80 in the second region 312 becomes longer than a distance d2 between the first electrode 60 and the second electrode 80 in the first region 311. As a consequence, when the voltage is applied between the first electrode 60 and the second electrode 80, an electric field intensity to be applied to the piezoelectric layer 70 in the second region 312 becomes less than an electric field intensity to be applied to the piezoelectric layer 70 in the first region 311.

In this way, the deformation of the second region 312 of the active portion 310 when the voltage is applied between the first electrode 60 and the second electrode 80 is further suppressed relative to the deformation of the first region 311. Thus, it is possible to more effectively suppress the occurrence of cracks in the vibration plate 50 associated with the repeated drive of the piezoelectric actuator 300.

Moreover, since the electric field intensity to be applied to the piezoelectric layer 70 in the second region 312 becomes less than the electric field intensity to be applied to the piezoelectric layer 70 in the first region 311, there are also effects of a reduction in power consumption by the piezoelectric actuator 300 and a reduction in heat generation by the piezoelectric actuator 300.

A material of the insulating layer 411 provided between the piezoelectric layer 70 and the second electrode 80 is not limited as long as it is an inorganic insulating material. Examples of usable materials include silicon oxide such as $SiO_2$, silicon nitride such as $Si_3N_4$, silicon oxide nitride such as $Si-O_x-N_y$, zirconium oxide such as $ZrO_2$, titanium oxide such as $TiO_2$, aluminum oxide such as $Al_2O_3$, hafnium oxide such as $HfO_2$, magnesium oxide such as MgO, lanthanum aluminate such as $LaAlO_3$, and the like.

Here, a material which has a high degree of adhesion to the piezoelectric layer 70 and the second electrode 80 may be used as the material of the insulating layer 411. To be more precise, a material having the Young's modulus and a linear expansion coefficient which are close to those of the piezoelectric layer 70 and the second electrode 80 may be used as the material of the insulating layer 411. In other words, the insulating layer 411 may be made of the material which is highly adhesive to the layers located above and below the insulating layer 411. In this way, it is possible to reduce detachment of the insulating layer 411 even when the piezoelectric actuator 300 is repeatedly driven.

Meanwhile, a dielectric constant of the insulating layer 411 made of the insulating material may be lower than a dielectric constant of the piezoelectric layer 70. In this way, capacitance of the piezoelectric layer 70 in the second region 312 is reduced and the heat generation of the piezoelectric actuator 300 is further suppressed. Note that a thickness of the insulating layer 411 is not limited and may be determined as appropriate in consideration of the displacement of the vibration plate 50 due to the drive of the piezoelectric actuator 300.

Meanwhile, as illustrated in FIG. 7, the thickness of the insulating layer 411 may be gradually reduced toward the outside of the pressure chamber 12 in the vicinity of the boundary between the second region 312 and the first region 311. Specifically, in the vicinity of the boundary between the second region 312 and the first region 311, the thickness of the insulating layer 411 may be gradually reduced toward the first region 311. In other words, an angle θ1 formed between an end surface 411a of the insulating layer 411 and the surface of the piezoelectric layer 70 may be set to an angle smaller than 90°.

In this way, when the voltage is applied between the first electrode 60 and the second electrode 80, an amount of displacement of the active portion 310 in the vicinity of the boundary between the second region 312 and the first region 311 is gradually changed instead of a rapid change. To be more precise, the amount of displacement of the active portion 310 is gradually reduced from the first region 311 side toward the second region 312 side. As a consequence, the occurrence of cracks in the vibration plate 50 can be suppressed more reliably in the vicinity of the boundary between the second region 312 and the first region 311. Moreover, a load on the piezoelectric actuator 300 can also be suppressed.

Here, the second region 312 of the active portion 310 only needs to be provided in the region opposed to the central part in the x-axis direction of the pressure chamber 12. To be more precise, when the pressure chamber 12 is equally divided into three regions S1, S2, and S3 in the x-axis direction, the second region 312 may be provided in the center region S2. Moreover, the second region 312 may be provided across a center line L1 in the x-axis direction of the pressure chamber 12 (see FIG. 5).

In addition, the second region 312 may be provided across a center line L2 in the x-axis direction of the active portion 310 within the region opposed to the pressure chamber 12, that is, of the flexible portion. In this embodiment, the active portion 310 extends to the outside of the two end portions in the x-axis direction of the pressure chamber 12, and the center line L2 in the x-axis direction of the flexible portion coincides with the center line L1 of the pressure chamber 12. Accordingly, the second region 312 of this embodiment is provided in the region S2 across the center line L1 of the pressure chamber 12 and across the center line L2 of the flexible portion.

Provision of the second region 312 at the above-described position makes it possible to more reliably suppress the occurrence of cracks in the vibration plate 50 attributed to the repeated drive of the piezoelectric actuator 300.

Meanwhile, the insulating layer 411 only needs to be provided at least at the portion corresponding to the second region 312 of the active portion 310. Here, the range for forming the insulating layer 411 may be determined as appropriate in consideration of the displacement of the vibration plate 50. For example, the insulating layer 411 may extend to the outside in the y-axis direction of the active portion 310. In this embodiment, the insulating layer 411 extends to the outside in the y-axis direction of the end portion of the first electrode 60 (see FIG. 6). In other words, the insulating layer 411 extends to the region opposed to the non-active portion 320 on the outside of the active portion 310.

Here, the insulating layer 411 may be provided with the region opposed to the pressure chamber 12. Specifically, the insulating layer 411 may be not provided in the region opposed to the end portion of the pressure chamber 12, or so-called the arm of the vibration plate 50. Thus, when the piezoelectric actuator 300 is driven, the vibration plate 50 can be displaced appropriately in the region opposed to the end portion of the pressure chamber 12. Accordingly, it is possible to maintain the good ejection characteristic due to the drive of the piezoelectric actuator 300 and to reduce the occurrence of cracks in the vibration plate 50 in this instance.

As described above, the ink jet printing head 1 being the liquid ejecting head according to this embodiment includes the flow passage forming substrate 10 provided with the pressure chambers 12 being the recesses, the vibration plate 50 provided on one surface side of the flow passage forming substrate 10, and the piezoelectric actuator 300 including the first electrode 60, the piezoelectric layer 70, and the second electrode 80 stacked on the surface of the vibration plate 50 on the opposite side of the flow passage forming substrate 10. The pressure chamber 12 has the shape in which the length in the x-axis direction is larger than the length in the y-axis direction intersecting with the x-axis direction. The piezoelectric actuator 300 includes the active portion 310, in which the piezoelectric layer 70 is sandwiched between the first electrode 60 and the second electrode 80. The active portion 310 includes the first region 311 provided in the region opposed to the pressure chamber 12 and extending in the x-axis direction, and the second region 312 provided in the region corresponding to the central part in the x-axis direction of the pressure chamber 12, and being configured such that the thickness of the portion of the laminated body 400 including the active portion 310 and the vibration plate 50 is larger than the thickness of the portion of the laminated body 400 corresponding to the first region 311 and that the deformation of the second region 312 is suppressed as compared to the deformation of the first region 311 when the voltage is applied between the first electrode 60 and the second electrode 80. Thus, it is possible to suppress the occurrence of cracks in the vibration plate 50 while maintaining the good ejection characteristic due to the drive of the piezoelectric actuator 300.

This embodiment depicts the example of the configuration in which the insulating layer 411 is provided between the piezoelectric layer 70 and the second electrode 80. However, the insulating layer 411 only needs to be provided between the first electrode 60 and the second electrode 80. For example, as illustrated in FIGS. 8 and 9, the insulating layer 411 may be provided between the first electrode 60 and the piezoelectric layer 70. In this case, the insulating layer 411 may be provided only on the first electrode 60. Alternatively, the insulating layer 411 may be provided in such a way as to cover two end surfaces in the y-axis direction of the first electrode 60. Moreover, when the piezoelectric layer 70 is formed from two or more piezoelectric layers, the insulating layer 411 may be provided between these piezoelectric layers.

When any of the above-mentioned configurations is adopted, the electric field intensity to be applied to the piezoelectric layer 70 in the second region 312 becomes less than the electric field intensity to be applied to the piezoelectric layer 70 in the first region 311 when the voltage is applied between the first electrode 60 and the second electrode 80. Accordingly, the deformation of the second region 312 when the voltage is applied between the first electrode 60 and the second electrode 80 is suppressed as compared to the deformation of the first region 311.

Second Embodiment

Figure 10:
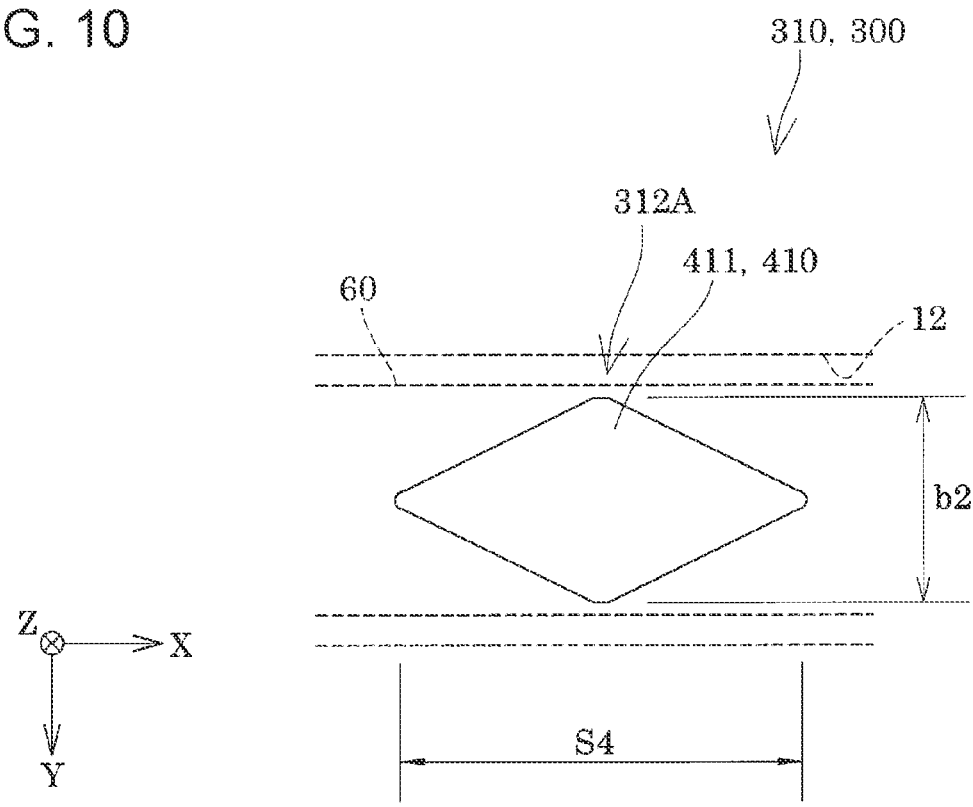
FIG. 10 is a plan view of a substantial part of a printing head according to a second embodiment.
Figure 11:
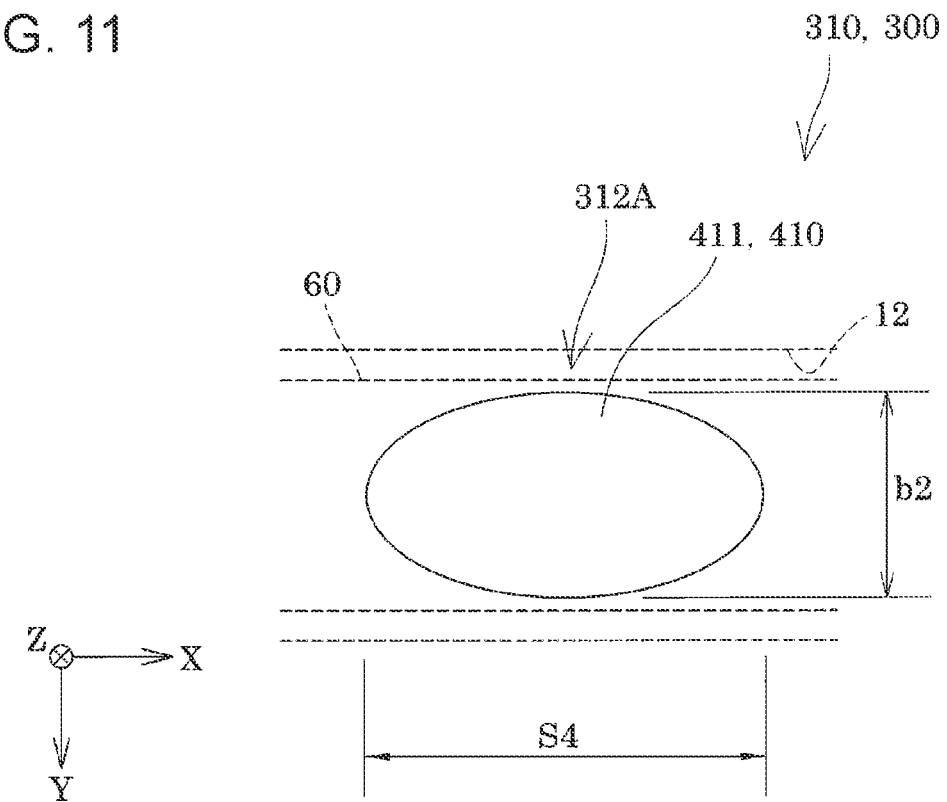
FIG. 11 is another cross-sectional view of the substantial part of the printing head according to the second embodiment.

FIG. 10 is an enlarged plan view illustrating a second region of a piezoelectric actuator according to a second embodiment, and FIG. 11 is an enlarged plan view illustrating another example of the second region of the actuator according to the second embodiment.

This embodiment represents a modified example of the second region being part of the piezoelectric actuator, and the configurations of the remaining constituents are the same as those of the first embodiment. In the drawings, the same constituents will be denoted by the same reference signs and overlapping explanations will be omitted.

The second region 312 according to the first embodiment is continuously present across the region opposed to the first electrode 60 in terms of the y-axis direction. In other words, the second region 312 according to the first embodiment is formed such that the length in the y-axis direction thereof has a substantially constant length in the x-axis direction. On the other hand, as illustrated in FIG. 10, a second region 312A according to this embodiment is formed into a rhombic shape in plan view in the z-axis direction. Specifically, the insulating layer 411 being the additional layer 410 is formed into a rhombus. In other words, the second region 312A provided with the insulating layer 411 is formed into such a shape that its length b2 in the y-axis direction is the largest at the central part in the x-axis direction thereof, and is gradually reduced toward each end portion in the x-axis direction thereof.

In this way, in a central region S4 of the active portion 310 provided with the second region 312A, the amount of displacement of the active portion 310 gradually changes in the x-axis direction. To be more precise, the deformation becomes smallest in the vicinity of two end portions in the x-axis direction in the central region S4 of the active portion 310, and the deformation becomes largest at the central part in the x-axis direction thereof. Accordingly, the amount of displacement of the active portion 310 is not rapidly changed but is instead gently changed in the vicinity of the end portion of the central region S4 of the active portion 310. As a consequence, the occurrence of cracks in the vibration plate 50 can be suppressed more reliably at this portion. Moreover, a load on the piezoelectric actuator 300 can also be suppressed.

Meanwhile, each of four corners of the second region 312A having the rhombic shape may be formed into a rounded shape. When the second region 312A is formed into the rhombic shape, the four corner portions are prone to develop stress concentration when the voltage is applied. However, this stress concentration can be suppressed by forming each of the four corner portions into the rounded shape.

Here, the shape of the second region 312A in plan view in the z-axis direction is not limited only to the rhombus as long as the second region 312A has such a shape that the length in the y-axis direction is the largest at the central part in the x-axis direction thereof, and is gradually reduced toward each end portion in the x-axis direction thereof. The shape of the second region 312A may be an elliptic shape as illustrated in FIG. 11, a pentagonal shape or other polygonal shapes with more angles, an oval shape, and the like. The oval shape stated herein refers to a shape which is mainly based on a rectangle and provided with two end portions formed into a semicircular shape. Nonetheless, the oval shape will also include a so-called rounded rectangular shape and the like.

Third Embodiment

Figure 12:
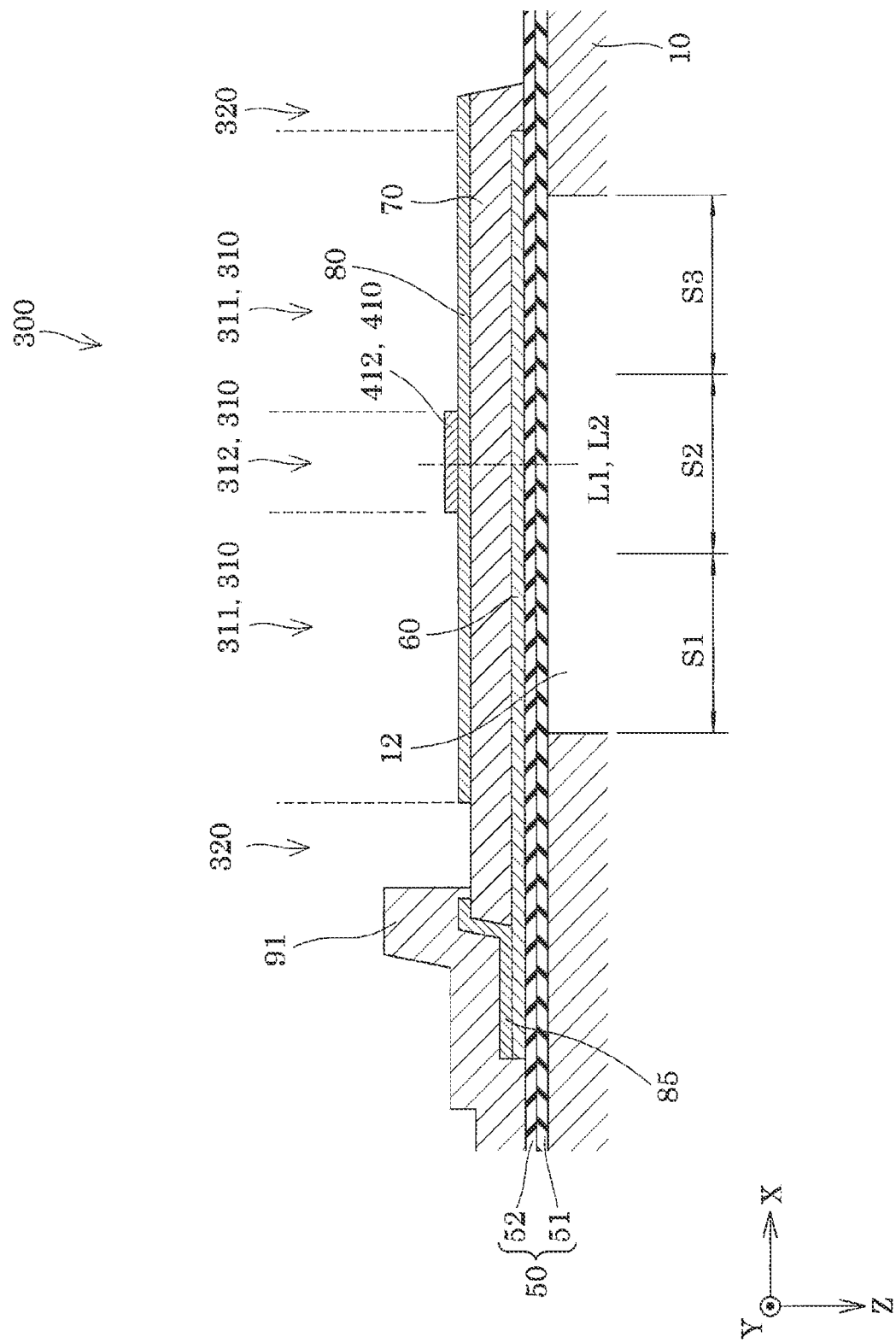
FIG. 12 is a cross-sectional view of a substantial part of a printing head according to a third embodiment.
Figure 13:
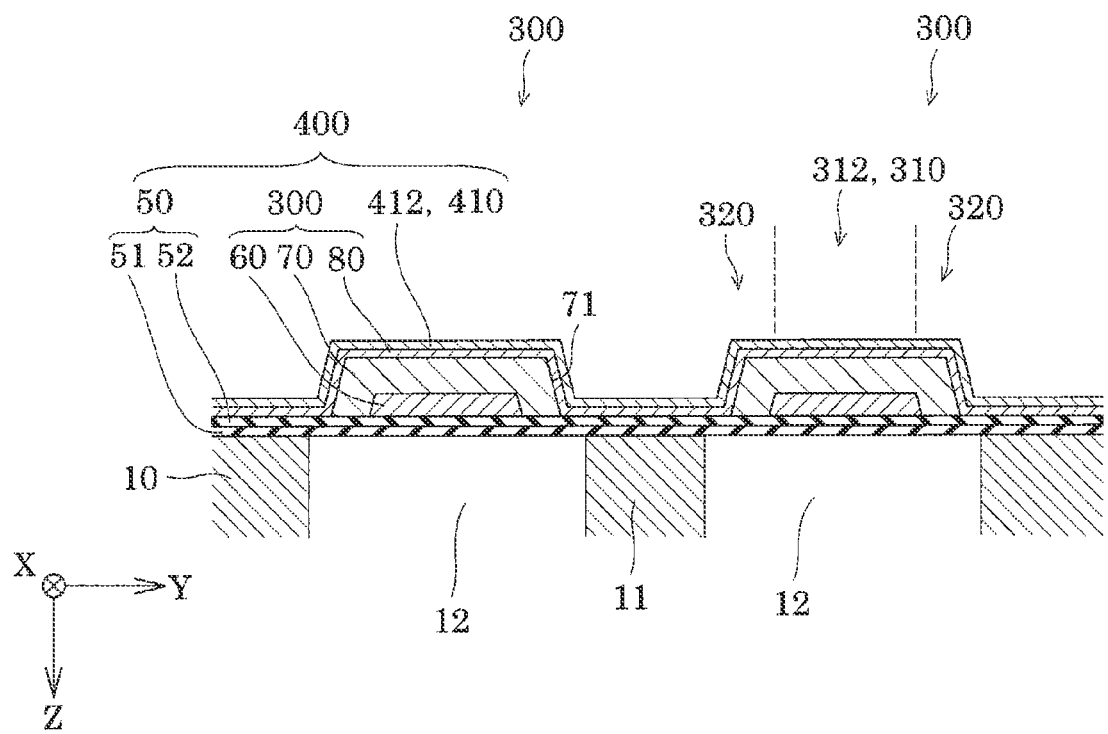
FIG. 13 is another cross-sectional view of the substantial part of the printing head according to the third embodiment.

FIGS. 12 and 13 are enlarged cross-sectional views illustrating a second region of a piezoelectric actuator according to a third embodiment.

This embodiment represents a modified example of the laminated body corresponding to the second region, and the configurations of the remaining constituents are the same as those of the first embodiment. In the drawings, the same constituents will be denoted by the same reference signs and overlapping explanations will be omitted.

In the first embodiment, the laminated body 400 corresponding to the second region 312 includes the insulating layer 411 provided between the piezoelectric layer 70 and the second electrode 80 and serving as the additional layer 410. On the other hand, as illustrated in FIGS. 12 and 13, the laminated body 400 according to this embodiment includes the additional layer 410 on the second electrode 80 corresponding to the second region 312.

This additional layer 410 is a metal layer 412 made of a metal material such as iridium and platinum. The metal layer 412 is provided on the second electrode 80 and in contact with the second electrode 80. Moreover, in this embodiment, the metal layer 412 is continuously provided across a region in the y-axis direction where the piezoelectric actuators 300 are formed.

According to the configuration of this embodiment described above, the rigidity of the second region 312 of the active portion 310 is increased by the metal layer 412, whereby the deformation of the second region 312 is suppressed as compared to the first region 311 when the voltage is applied between the first electrode 60 and the second electrode 80. In this way, when driving the piezoelectric actuator 300, the displacement of the vibration plate 50 at the central part in the x-axis direction of the pressure chamber 12 is partially suppressed. As a consequence, the configuration of this embodiment can also suppress the occurrence of cracks in the vibration plate 50 associated with the repeated drive of the piezoelectric actuator 300.

Moreover, since the metal layer 412 is continuously provided across the region in the y-axis direction where the piezoelectric actuators 300 are formed, the metal layer 412 also functions as the common electrode for the piezoelectric actuators 300 together with the second electrode 80. Thus, it is also possible to suppress the occurrence of a voltage drop in the common electrode. In the meantime, the metal layer 412 made of the metal material has relatively high ductility. Accordingly, the occurrence of cracks in the vibration plate 50 can be suppressed more easily by continuously providing this metal layer 412 across the region opposed to the piezoelectric actuators 300.

In this embodiment, the metal layer 412 is provided on the second electrode 80. However, the metal layer 412 may be provided between the piezoelectric layer 70 and the second electrode 80 and in contact with the second electrode 80 as with the insulating layer 411 of the first embodiment. This configuration also increases the rigidity of the second region 312 in the piezoelectric actuator 300, which makes it possible to suppress the occurrence of cracks in the vibration plate 50 associated with the repeated drive of the piezoelectric actuator 300.

OTHER EMBODIMENTS

The embodiments of the present disclosure have been described above. However, the basic configuration of the present disclosure is not limited only to the above-described embodiments.

For example, the above-described embodiments have discussed the configuration to suppress the deformation of the second region 312 of the active portion 310 relative to the first region 311 thereof when the voltage is applied between the first electrode 60 and the second electrode 80, by providing the portion of the laminated body 400 corresponding to the second region 312 with the additional layer 410 which is either the insulating layer 411 or the metal layer 412, for example. However, the laminated body 400 does not always have to be provided with the additional layer 410.

For example, instead of providing the laminated body 400 with the additional layer 410, any of the elastic film 51, the insulator film 52, the first electrode 60, the piezoelectric layer 70, and the second electrode 80 may be formed thicker than the remaining portion. In other words, a portion of any of the layers of the laminated body 400 corresponding to the second region 312 may be formed thicker than the remaining portion. This configuration also suppresses the deformation of the second region 312 relative to the first region 311 when the voltage is applied between the first electrode 60 and the second electrode 80.

In this embodiment, the second region 312 is formed in the region corresponding to the central part in the x-axis direction of the pressure chamber 12 and across the entire active portion 310 in the y-axis direction. However, the configuration of the second region 312 is not limited only to the foregoing.

Figure 14:
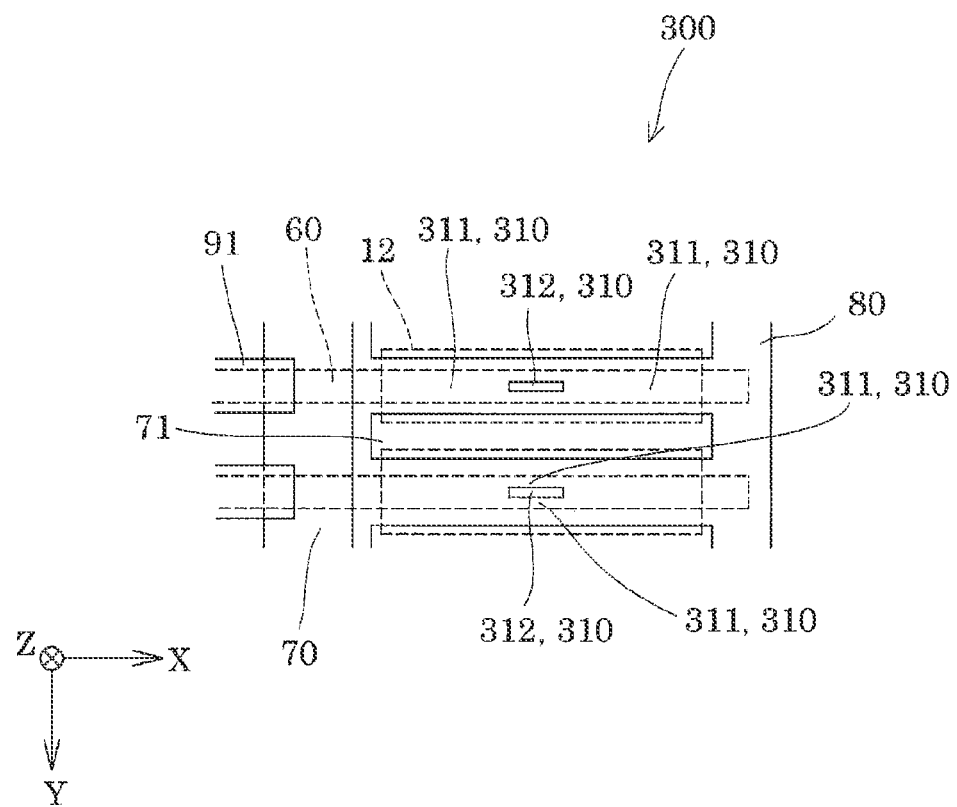
FIG. 14 is a plan view of a substantial part of a printing head according to another embodiment.

As illustrated in FIG. 14, for example, the second region 312 may be formed in the region corresponding to the central part in the x-axis direction of the pressure chamber 12 and at a central part of the active portion 310 in the y-axis direction. Specifically, the second region 312 may be provided in the region corresponding to the central part in the x-axis direction of the pressure chamber 12 and the first region 311 may be present on two sides in the y-axis direction of the second region 312. In other words, the second region 312 may be provided in an island shape at the central part of the first region 311 that extends in the region opposed to the pressure chamber 12 in plan view in the z-axis direction, and the periphery of the second region 312 may be surrounded by the first region 311.

Meanwhile, the above-described embodiments have discussed the configuration in which the active portion 310 extends to the outside of the two end portions of the pressure chamber 12 in the x-axis direction, or in other words, the configuration in which the length of the flexible portion of the active portion 310 coincides with the length of the pressure chamber 12. However, the configuration of the piezoelectric actuator 300 is not limited to a particular configuration.

For example, the active portion 310 may be located inside the pressure chamber 12 in the x-axis direction. Specifically, the length of the flexible portion in the x-axis direction may be smaller than the length of the pressure chamber 12. In this case, however, the active portion 310 may extend to the vicinity of the end portion of the pressure chamber 12, and may be located at the center in the x-axis direction of the pressure chamber 12.

Figure 15:
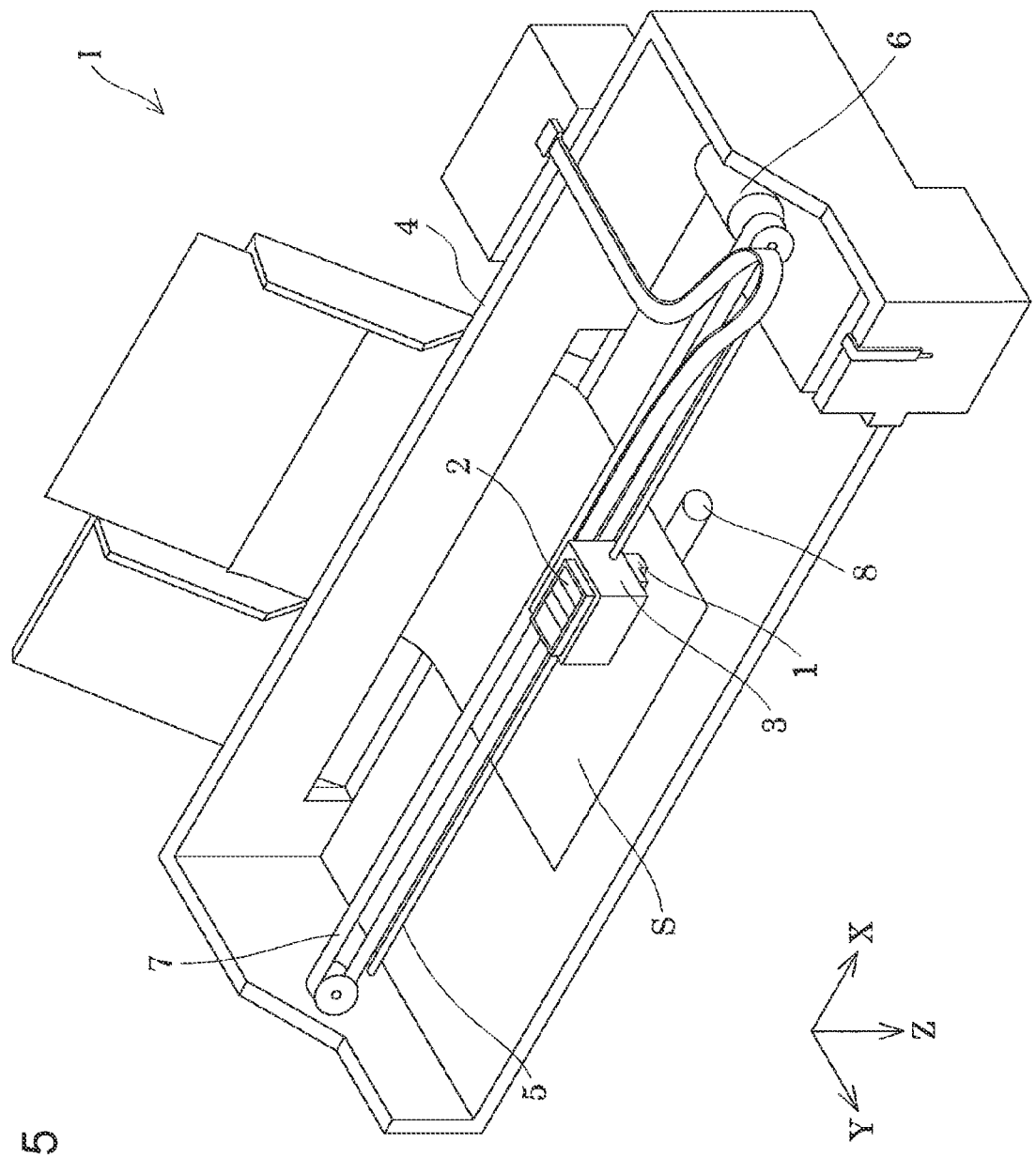
FIG. 15 is a diagram illustrating a schematic configuration of a printing apparatus according to an embodiment.

In the meantime, the ink jet printing head 1 of each of these embodiments is mounted on an ink jet printing apparatus that represents an example of a liquid ejecting apparatus. FIG. 15 is a schematic diagram illustrating an example of an ink jet printing apparatus that represents an example of a liquid ejecting apparatus of one embodiment.

In an ink jet printing apparatus I illustrated in FIG. 15, cartridges 2 constituting an ink supply unit are attachably and detachably provided to the ink jet printing head 1, and the ink jet printing head 1 is mounted on a carriage 3. The carriage 3 mounting the ink jet printing head 1 is provided in such a way as to be movable in an axial direction of a carriage shaft 5 fitted to an apparatus body 4.

Moreover, drive force of a driving motor 6 is transmitted to the carriage 3 through not-illustrated gears and a timing belt 7, whereby the carriage 3 mounting the ink jet printing head 1 moves along the carriage shaft 5. Meanwhile, the apparatus body 4 is provided with transportation rollers 8 serving as a transportation unit, and a print sheet S being a print medium such as paper is transported by the transportation rollers 8. Here, the transportation unit to transport the print sheet S is not limited only to the transportation rollers. The transportation unit may be a belt, a drum, and so forth.

The above-described ink jet printing apparatus I transports the print sheet S in the +x direction relative to the ink jet printing head 1, and ejects the ink droplets from the ink jet printing head 1 while reciprocating the carriage 3 in the y direction relative to the print sheet S. Thus, the ink jet printing apparatus I executes so-called printing in such a way that the ink droplets from the ink jet printing head 1 are landed substantially on the entire surface of the print sheet S.

Meanwhile, the above-described ink jet printing apparatus I depicts the example in which the ink jet printing head 1 is mounted on the carriage 3 and subjected to reciprocation in the y direction being a main scanning direction. However, the ink jet printing apparatus is not limited only to this configuration. For example, the present disclosure is also applicable to a so-called line-type printing apparatus, which is configured to perform printing merely by moving the print sheet S such as paper in the x direction being a vertical scanning direction while fixing the ink jet printing head 1.

The above-described embodiments have explained the ink jet printing head as an example of the liquid ejecting head and the ink jet printing apparatus as an example of the liquid ejecting apparatus. However, the present disclosure is targeted for broad ranges of liquid ejecting heads and liquid ejecting apparatuses in general. In this regard, the present disclosure is naturally applicable to liquid ejecting heads and liquid ejecting apparatuses configured to eject liquids other than inks. Examples of other liquid ejecting heads include various printing heads used for image printing apparatuses such as printers, a coloring material ejecting head used for manufacturing color filters for liquid crystal display units and the like, an electrode material ejecting head used for forming electrodes for organic EL display units and field emission display (FED) units, a bioorganic substance ejecting head used for manufacturing biochips, and the like. The present disclosure is also applicable to liquid ejecting apparatuses including any of the aforementioned liquid ejecting heads.

Meanwhile, the present disclosure is applicable not only to liquid ejecting heads represented by an ink jet printing head, but also to piezoelectric devices including an ultrasonic device such as an ultrasonic transmitter, an ultrasonic motor, a pressure sensor, a pyroelectric sensor, and so forth.

What is claimed is:

1. A piezoelectric device comprising:
   a vibration plate provided on one surface side of a substrate provided with a plurality of recesses; and
   a piezoelectric actuator including a first electrode, a piezoelectric layer, and a second electrode stacked on a surface of the vibration plate on an opposite side of the substrate, wherein
   the recesses have a shape in which a length in a first direction is larger than a length in a second direction intersecting with the first direction,
   the piezoelectric actuator includes an active portion provided in a region opposed to one of the recesses, in which the piezoelectric layer is sandwiched between the first electrode and the second electrode, and
   the active portion includes
   a first region provided in a region opposed to the recess and extending in the first direction, and
   a second region provided in a region corresponding to a central part in the first direction of the recess, and being configured such that a laminated body including the active portion and the vibration plate has a thickness larger than a thickness of a portion corresponding to the first region and that deformation of the second region is suppressed as compared to deformation of the first region when a voltage is applied between the first electrode and the second electrode,
   wherein the first region and the second region are aligned in the first direction.

2. The piezoelectric device according to claim 1, wherein the second region is provided in a central region when the recess is equally divided into three regions in the first direction.

3. The piezoelectric device according to claim 1, wherein a thickness of a portion of the laminated body corresponding to the second region located on the piezoelectric actuator side relative to the vibration plate is larger than a thickness of a portion of the laminated body corresponding to the first region.

4. The piezoelectric device according to claim 1, wherein at a portion of the second region near a boundary with the first region, a thickness of the laminated body is gradually reduced toward an outer side of the recess.

5. The piezoelectric device according to claim 1, wherein a portion of the laminated body corresponding to the second region includes an additional layer provided separately from respective layers that form the vibration plate and the piezoelectric actuator.

6. The piezoelectric device according to claim 5, wherein the additional layer is an insulating layer made of an inorganic insulating material and provided between the first electrode and the second electrode.

7. The piezoelectric device according to claim 6, wherein a dielectric constant of the insulating layer is lower than a dielectric constant of the piezoelectric layer.

8. The piezoelectric device according to claim 6, wherein a distance between the first electrode and the second electrode in the second region is at least 1.05 times as large as a distance between the first electrode and the second electrode in the first region opposed to the recess.

9. The piezoelectric device according to claim 5, wherein the additional layer is a metal layer made of a metal material and provided on the second electrode side relative to the piezoelectric layer and in contact with the second electrode.

10. The piezoelectric device according to claim 9, wherein
the second electrode forms a common electrode provided in common to a plurality of the piezoelectric actuators, and
the metal layer is continuously provided in the second direction across a region opposed to the plurality of recesses.

11. The piezoelectric device according to claim 1, wherein
a length in the second direction of the second region is largest at a central part in the first direction of the second region and is reduced toward an end portion side in the first direction.

12. The piezoelectric device according to claim 1, wherein
groove portions having a thickness of the piezoelectric layer smaller than a thickness of the piezoelectric layer at a remaining portion are provided in regions opposed to two end portions of the recesses in the second direction.

13. A liquid ejecting head comprising:
a substrate provided with a plurality of recesses;
a vibration plate provided on one surface side of the substrate; and
a piezoelectric actuator including a first electrode, a piezoelectric layer, and a second electrode stacked on a surface of the vibration plate on an opposite side of the substrate, wherein
the recesses have a shape in which a length in a first direction is larger than a length in a second direction intersecting with the first direction,
the piezoelectric actuator includes an active portion provided in a region opposed to one of the recesses, in which the piezoelectric layer is sandwiched between the first electrode and the second electrode, and
the active portion includes
a first region provided in a region opposed to the recess and extending in the first direction, and
a second region provided in a region corresponding to a central part in the first direction of the recess, and being configured such that a laminated body including the active portion and the vibration plate has a thickness larger than a thickness of a portion corresponding to the first region and that deformation of the second region is suppressed as compared to deformation of the first region when a voltage is applied between the first electrode and the second electrode,
wherein the first region and the second region are aligned in the first direction.

14. A liquid ejecting apparatus comprising:
the liquid ejecting head according to claim 13.

* * * * *